United States Patent
Kaku et al.

(10) Patent No.: US 6,968,497 B2
(45) Date of Patent: Nov. 22, 2005

(54) ERROR CORRECTION DEVICE AND ERROR CORRECTION METHOD

(75) Inventors: Takashi Kaku, Kawasaki (JP); Ryoji Okita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 568 days.

(21) Appl. No.: 10/109,370

(22) Filed: Mar. 28, 2002

(65) Prior Publication Data

US 2003/0084400 A1    May 1, 2003

(30) Foreign Application Priority Data

Oct. 26, 2001    (JP) .............................. 2001-329481

(51) Int. Cl.[7] .......................... G06F 11/00; H03M 13/00
(52) U.S. Cl. ..................................... 714/800; 714/746
(58) Field of Search ................................ 714/746, 800, 714/801, 817, 818; 386/2; 375/331, 346

(56) References Cited

U.S. PATENT DOCUMENTS

| 5,426,652 A | 6/1995 | Heiman |
| 5,550,837 A | 8/1996 | Chang |
| 5,708,667 A | 1/1998 | Hayashi |
| 5,768,291 A | 6/1998 | Kelton et al. |
| 6,574,768 B2 * | 6/2003 | Cypher ........................ 714/758 |

OTHER PUBLICATIONS

Ericson, et al. 'Superimposed codes in the Hamming space,' IEEE Transactions on Information Theory, Nov. 1994, vol.: 40, Issue: 6, page(s): 1882-1893.*

Saulnier, et al., "OFDM Spread Spectrum Communications Using Lapped Transforms and Interference Excision" Communications, 1997 IEEE XP010227242; ISBN: 0-7803-3925-8, pp. 944-948.

* cited by examiner

*Primary Examiner*—Guy J. Lamarre
(74) *Attorney, Agent, or Firm*—Katten Muchin Rosenman LLP

(57) ABSTRACT

The present invention is concerned with an error correction device and method for correcting errors in data items sent on a plurality of channels. An identification unit calculates an exclusive OR value for data items sent on the plurality of channels, and adopts the calculated value as data sent on a separate error correction channel. A signal quality detection unit detects the signal qualities concerning the plurality of channels. If the exclusive OR value is not equal zero, an identifying and processing unit replaces data on a channel whose signal quality is detected to be worst with an exclusive OR value for data items sent on channels other than the channel whose signal quality is worst.

10 Claims, 29 Drawing Sheets

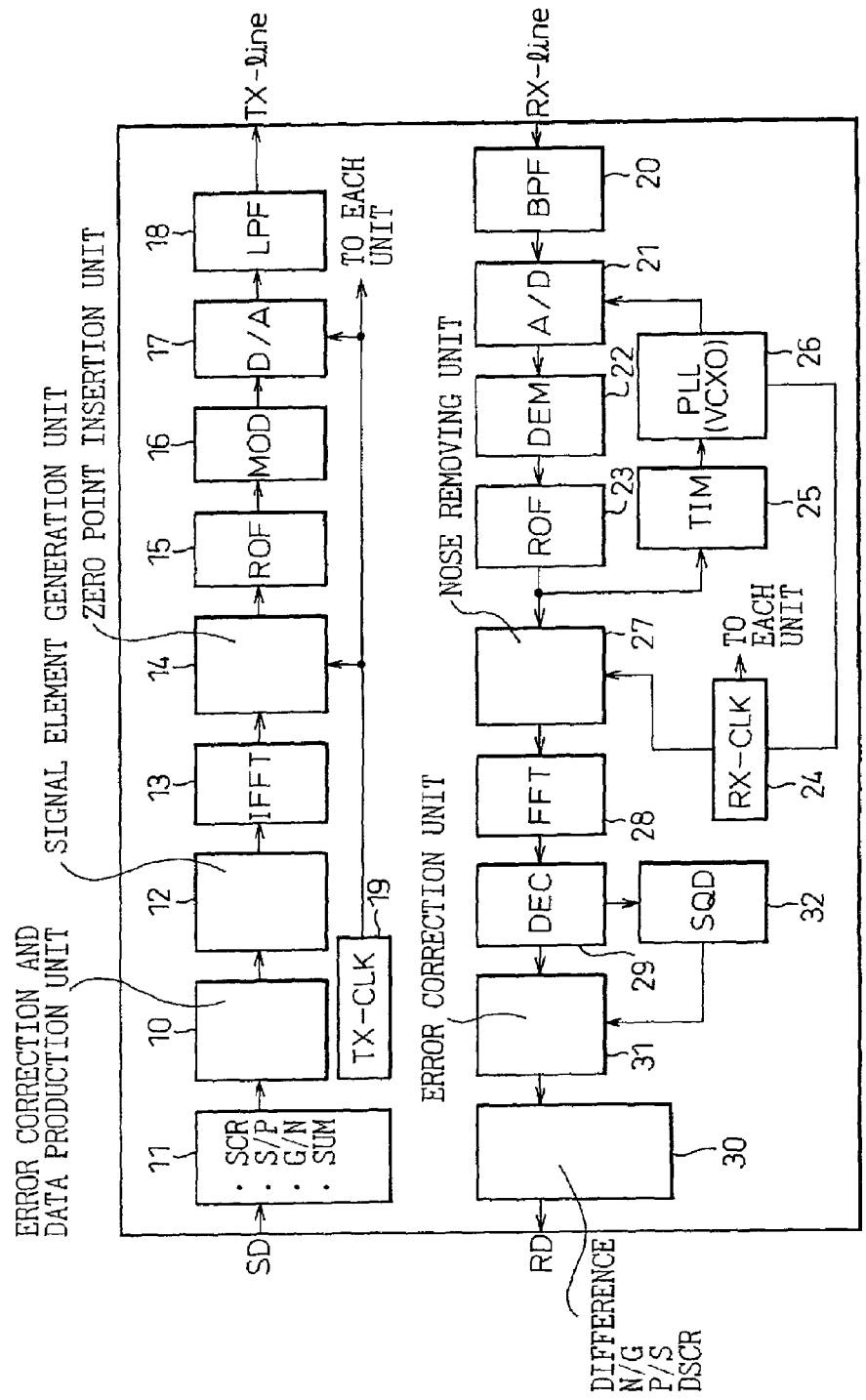

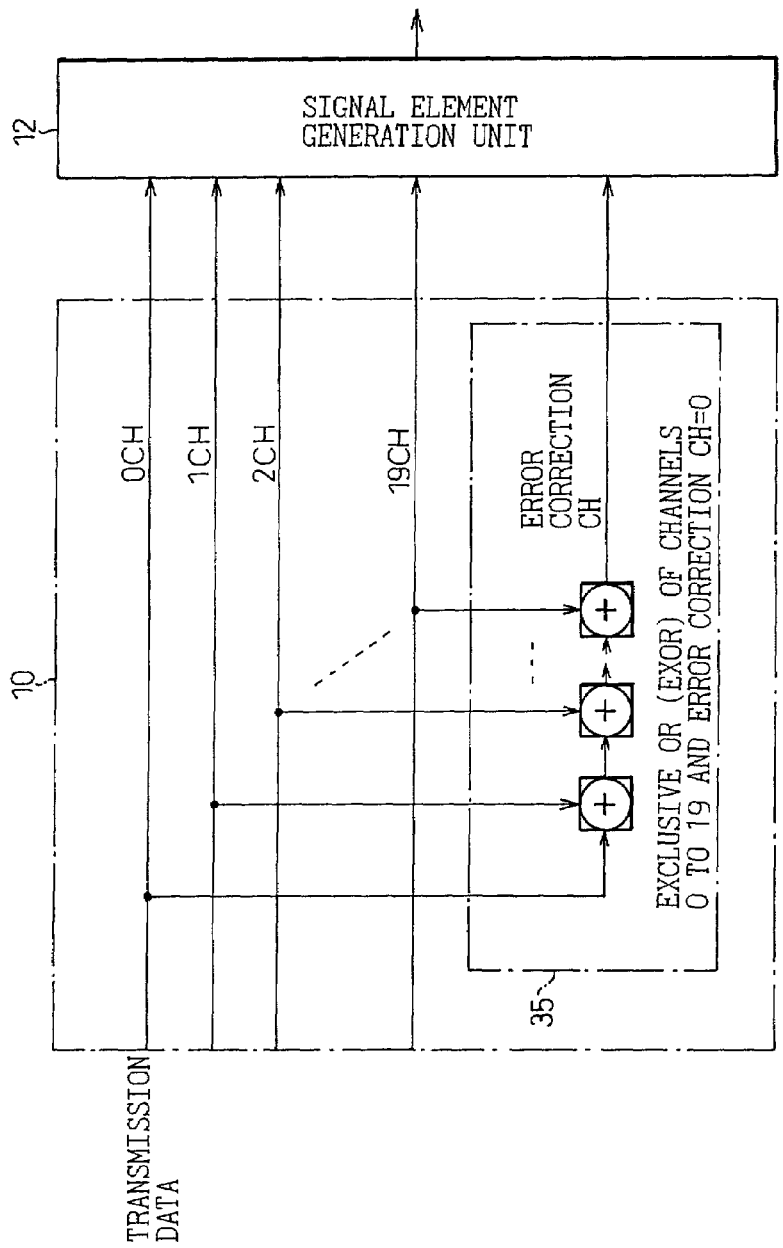

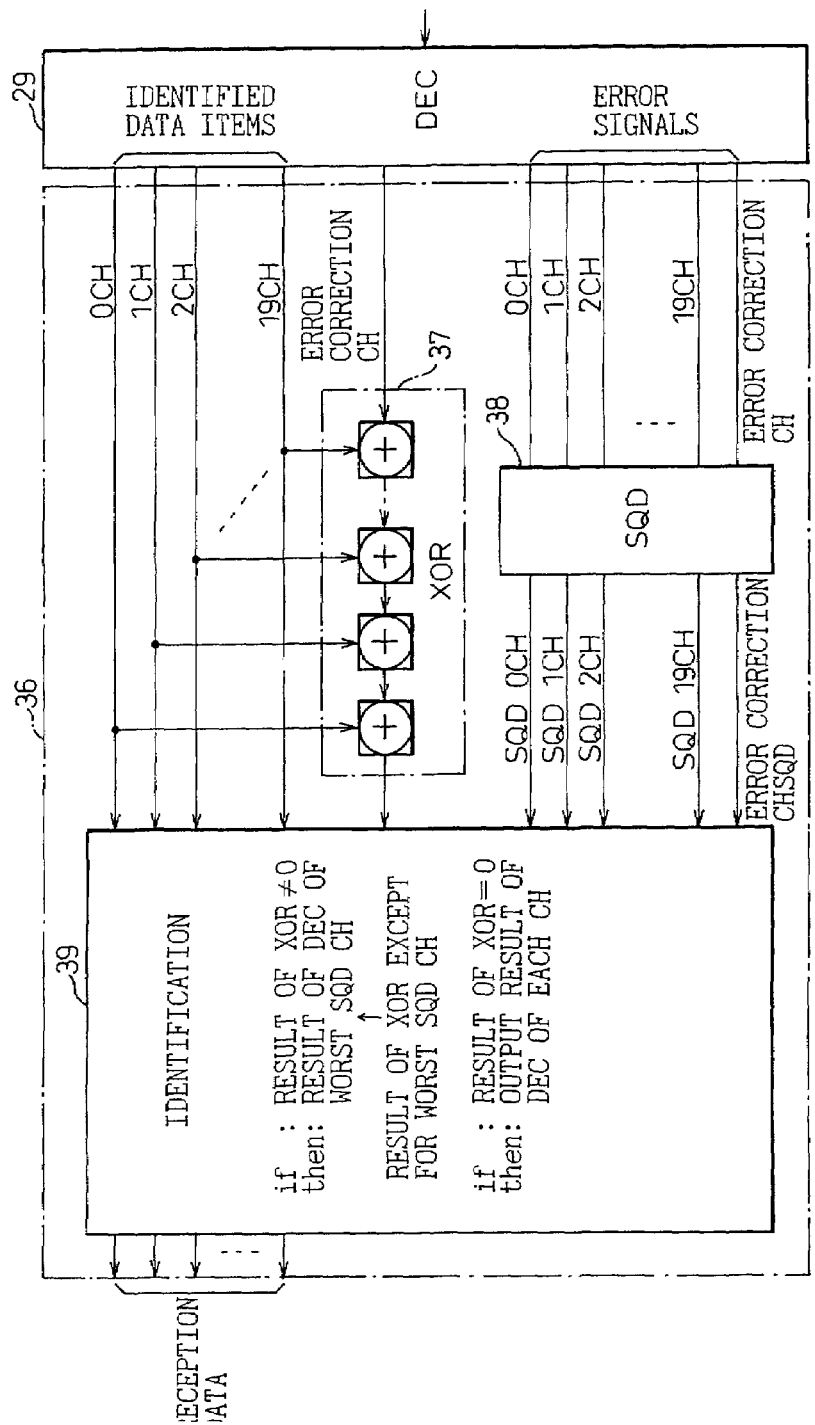

REGULAR
TETRAHEDRON

REGULAR
HEXAHEDRON

REGULAR
OCTAHEDRON

REGULAR
DODECAHEDRON

REGULAR
ICOSAHEDRON

| CH NUMBER | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|
| 0 | O | O | O | O | O | O | O | O | O | | | | | | | | | | | | | | | | | | | | | | |
| 1 | O | O | O | O | O | O | O | | | | O | | | | | | | | | | | | | | | | | | | | |
| 2 | O | O | O | O | O | O | | | | O | O | | | | | | | | | | | | | | | | | | | | |
| 3 | O | O | O | O | O | O | | | O | O | | | | | | | | | | | | | | | | | | | | | |
| 4 | O | O | O | O | O | O | O | | O | O | | | | | | | | | | | | | | | | | | | | | |
| 5 | O | O | O | O | O | | O | O | | | O | | | | | | | | | | | | | | | | | | | | |
| 6 | O | O | O | O | | | O | O | | | O | O | | | | | | | | | | | | | | | | | | | |
| 7 | O | O | O | O | | | O | | | O | O | O | | | | | | | | | | | | | | | | | | | |
| 8 | O | O | O | O | | O | O | | | O | O | O | | | | | | | | | | | | | | | | | | | |
| 9 | O | | O | O | O | | O | O | | | O | O | | | | | | | | | | | | | | | | | | | |
| 10 | O | | O | O | O | | O | O | O | | | O | | | | | | | | | | | | | | | | | | | |
| 11 | O | | O | O | O | O | O | O | O | | | | | | | | | | | | | | | | | | | | | | |
| 12 | O | | O | O | O | O | O | O | | | O | | | | | | | | | | | | | | | | | | | | |
| 13 | O | | O | O | O | O | | O | O | O | | O | | | | | | | | | | | | | | | | | | | |
| 14 | O | O | | O | O | O | | O | O | O | | | | | | | | | | | | | | | | | | | | | |
| 15 | O | O | | O | O | O | | O | O | O | | O | | | | | | | | | | | | | | | | | | | |
| 16 | O | O | | O | O | | | O | O | O | O | | | | | | | | | | | | | | | | | | | | |
| 17 | O | O | O | O | | O | O | | O | O | O | | | | | | | | | | | | | | | | | | | | |
| 18 | O | O | O | O | | O | | | O | O | O | O | | | | | | | | | | | | | | | | | | | |
| 19 | O | O | O | | O | O | | O | O | O | O | | | | | | | | | | | | | | | | | | | | |
| 20 | | | | | | | | | | | | | EC | | | | | | | | | | | | | | | | | | |
| 21 | | | | | | | | | | | | | | EC | | | | | | | | | | | | | | | | | |
| 22 | | | | | | | | | | | | | | | EC | | | | | | | | | | | | | | | | |
| 23 | | | | | | | | | | | | | | | | EC | | | | | | | | | | | | | | | |
| 24 | | | | | | | | | | | | | | | | | EC | | | | | | | | | | | | | | |
| 25 | | | | | | | | | | | | | | | | | | EC | | | | | | | | | | | | | |
| 26 | | | | | | | | | | | | | | | | | | | EC | | | | | | | | | | | | |
| 27 | | | | | | | | | | | | | | | | | | | | EC | | | | | | | | | | | |
| 28 | | | | | | | | | | | | | | | | | | | | | EC | | | | | | | | | | |
| 29 | | | | | | | | | | | | | | | | | | | | | | EC | | | | | | | | | |
| 30 | | | | | | | | | | | | | | | | | | | | | | | EC | | | | | | | | |
| 31 | | | | | | | | | | | | | | | | | | | | | | | | EC | | | | | | | |

CH NUMBER

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 1 | ▨ | ▨ | ▨ | 2 | 1 | 1 | 2 | 3 | ▨ | ▨ | ▨ | 2 | 3 | 1 | 3 | 1 | ▨ | ▨ | ▨ | 3 | 3 EC | | | | ▨ | ▨ | ▨ | | | | | |
| 2 | ▨ | ▨ | ▨ | 3 | 3 | 3 | 1 | 1 | ▨ | ▨ | ▨ | | | 1 | 3 | 1 | ▨ | ▨ | ▨ | 3 | | EC | | | ▨ | ▨ | ▨ | | | | | |
| 3 | ▨ | ▨ | ▨ | 3 | 1 | 3 | 1 | 3 | ▨ | ▨ | ▨ | 2 | | 2 | 1 | 2 | ▨ | ▨ | ▨ | 3 | | | EC | | ▨ | ▨ | ▨ | | | | | |
| 4 | ▨ | ▨ | ▨ | 1 | 1 | 2 | 3 | 1 | ▨ | ▨ | ▨ | 2 | 3 | 2 | 2 | | ▨ | ▨ | ▨ | | | | | | ▨ | ▨ | ▨ | | | | | |
| 5 | ▨ | ▨ | ▨ | 2 | 2 | 2 | | | ▨ | ▨ | ▨ | 1 | 3 | 3 | 1 | 2 | ▨ | ▨ | ▨ | 1 | | | | | ▨ | ▨ | ▨ | | | | | |
| 6 | ▨ | ▨ | ▨ | 2 | 1 | | 1 | 3 | ▨ | ▨ | ▨ | 1 | 2 | 1 | 2 | 2 | ▨ | ▨ | ▨ | 1 | | | | | ▨ | ▨ | ▨ | | | | | |
| 7 | ▨ | ▨ | ▨ | | | 1 | 1 | | ▨ | ▨ | ▨ | 2 | 1 | 1 | 3 | 1 | ▨ | ▨ | ▨ | | | | | | ▨ | ▨ | ▨ | EC | | | | |
| 8 | ▨ | ▨ | ▨ | 2 | 3 | 1 | 1 | 3 | ▨ | ▨ | ▨ | 1 | 1 | 3 | 1 | 3 | ▨ | ▨ | ▨ | | | | | | ▨ | ▨ | ▨ | | EC | | | |
| 9 | ▨ | ▨ | ▨ | 3 | | 2 | | 1 | ▨ | ▨ | ▨ | | 1 | 3 | 2 | 3 | ▨ | ▨ | ▨ | 1 | | | | | ▨ | ▨ | ▨ | | | EC | | |
| 10 | ▨ | ▨ | ▨ | | 2 | 3 | 2 | 1 | ▨ | ▨ | ▨ | 2 | 1 | 2 | 1 | | ▨ | ▨ | ▨ | 1 | | | | | ▨ | ▨ | ▨ | | | | EC | |
| 11 | ▨ | ▨ | ▨ | | 3 | | 2 | 3 | ▨ | ▨ | ▨ | | 1 | 2 | 2 | | ▨ | ▨ | ▨ | | | | | | ▨ | ▨ | ▨ | | | | | |
| 12 | ▨ | ▨ | ▨ | | | 3 | 2 | 1 | ▨ | ▨ | ▨ | | 2 | 2 | | 3 | ▨ | ▨ | ▨ | 2 | | | | | ▨ | ▨ | ▨ | | | | | EC |

ERROR columns: 0–2, 8–10, 16–18, 24–26

Fig.10A

|    | 0 | 1 | 2 | 8 | 9 | 10 | 16 | 17 | 18 | 24 | 25 | 26 |
|----|---|---|---|---|---|----|----|----|----|----|----|----|
| 1  | 1 | 1 | 3 | 2 | 3 | 3  | 2  | 2  | 2  |    |    |    |
| 2  | 3 | 2 | 3 | 1 |   |    | 1  | 1  | 2  |    |    |    |
| 3  | 2 | 1 | 2 | 1 | 3 | 2  |    | 1  | 1  |    |    |    |
| 4  | 2 | 2 | 2 | 2 | 1 | 2  |    |    |    |    |    |    |
| 5  | 2 | 1 | 1 |   | 2 | 1  | 2  | 2  |    | 1  |    |    |
| 6  | 1 | 3 | 1 | 2 |   |    | 1  | 3  | 2  |    | 1  |    |
| 7  | 1 | 2 |   | 2 | 1 | 0  |    |    |    |    |    | 1  |
| 8  | 3 |   |   |   | 1 | 3  |    |    |    |    |    |    |
| 9  |   |   |   |   |   | 3  | 1  | 2  | 3  |    |    |    |
| 10 |   |   | 1 | 1 |   |    | 2  | 3  | 1  |    |    |    |
| 11 |   |   | 3 | 3 | 3 |    | 1  | 1  | 3  |    |    |    |
| 12 |   |   |   |   | 3 | 2  | 1  |    | 3  |    |    |    |

Fig.10B

FIRST STEP: COEFFICIENTS OF OCH EXCEPT FOR SURFACE 1 ARE SET TO 0

|    | 0 | 1  | 2  | 8  | 9  | 10 | 16 | 17 | 18 | 24 | 25 | 26 |
|----|---|----|----|----|----|----|----|----|----|----|----|----|
| 1  | 1 | 1  | 3  | 2  | 3  | 3  | 2  | 2  | 2  | 0  | 0  | 0  |
| 2  | 0 | -1 | -6 | -5 | -9 | -9 | -5 | -5 | -4 | 0  | 0  | 0  |
| 3  | 0 | -1 | -4 | -3 | -3 | -4 | -4 | -3 | -3 | 0  | 0  | 0  |
| 4  | 0 | 0  | -4 | -2 | -5 | -4 | -4 | -4 | -4 | 0  | 0  | 0  |
| 5  | 0 | -1 | -5 | -4 | -4 | -5 | -2 | -2 | -4 | 1  | 0  | 0  |
| 6  | 0 | 2  | -2 | 0  | -3 | -3 | -1 | 1  | 0  | 0  | 1  | 0  |
| 7  | 0 | 1  | -3 | 0  | -2 | 0  | -2 | -2 | -2 | 0  | 0  | 1  |
| 8  | 0 | -3 | -9 | -6 | -8 | -6 | -6 | -6 | -6 | 0  | 0  | 0  |
| 9  | 0 | 0  | 0  | 0  | 0  | 3  | 1  | 2  | 3  | 0  | 0  | 0  |
| 10 | 0 | 0  | 1  | 1  | 0  | 0  | 2  | 3  | 1  | 0  | 0  | 0  |
| 11 | 0 | 1  | 3  | 3  | 3  | 0  | 1  | 1  | 3  | 0  | 0  | 0  |
| 12 | 0 | 0  | 0  | 0  | 3  | 2  | 1  | 0  | 3  | 0  | 0  | 0  |

Fig.11A

SECOND STEP: COEFFICIENTS OF 1CH EXCEPT FOR SURFACE 11 ARE SET TO 0

|    | 0 | 1 | 2  | 8  | 9  | 10 | 16 | 17 | 18 | 24 | 25 | 26 |
|----|---|---|----|----|----|----|----|----|----|----|----|----|
| 1  | 1 | 0 | 0  | -1 | 0  | 3  | 1  | 1  | -1 | 0  | 0  | 0  |
| 2  | 0 | 0 | -3 | -2 | -6 | -9 | -4 | -4 | -1 | 0  | 0  | 0  |
| 3  | 0 | 0 | -1 | 0  | 0  | -4 | -3 | -2 | 0  | 0  | 0  | 0  |
| 4  | 0 | 0 | -4 | -2 | -5 | -4 | -4 | -4 | -4 | 0  | 0  | 0  |
| 5  | 0 | 0 | -2 | -1 | -1 | -5 | -1 | -1 | -1 | 1  | 0  | 0  |
| 6  | 0 | 0 | -8 | -6 | -9 | -3 | -3 | -1 | -6 | 0  | 1  | 0  |
| 7  | 0 | 0 | -6 | -3 | -5 | 0  | -3 | -3 | -5 | 0  | 0  | 1  |
| 8  | 0 | 0 | 0  | 3  | 1  | -6 | -3 | -3 | 3  | 0  | 0  | 0  |
| 9  | 0 | 0 | 0  | 0  | 0  | 3  | 1  | 2  | 3  | 0  | 0  | 0  |
| 10 | 0 | 0 | 1  | 1  | 0  | 0  | 2  | 3  | 1  | 0  | 0  | 0  |
| 11 | 0 | 1 | 3  | 3  | 3  | 0  | 1  | 1  | 3  | 0  | 0  | 0  |
| 12 | 0 | 0 | 0  | 0  | 3  | 2  | 1  | 0  | 3  | 0  | 0  | 0  |

Fig.11B

THIRD STEP: COEFFICIENTS OF 2CH EXCEPT FOR SURFACE 10 ARE SET TO 0

|    | 0 | 1 | 2 | 8  | 9  | 10 | 16 | 17 | 18 | 24 | 25 | 26 |
|----|---|---|---|----|----|----|----|----|----|----|----|----|
| 1  | 1 | 0 | 0 | -1 | 0  | 3  | 1  | 1  | -1 | 0  | 0  | 0  |
| 2  | 0 | 0 | 0 | 1  | -6 | -9 | 2  | 5  | 2  | 0  | 0  | 0  |
| 3  | 0 | 0 | 0 | 1  | 0  | -4 | -1 | 1  | 1  | 0  | 0  | 0  |
| 4  | 0 | 0 | 0 | 2  | -5 | -4 | 4  | 8  | 0  | 0  | 0  | 0  |
| 5  | 0 | 0 | 0 | 1  | -1 | -5 | 3  | 5  | 1  | 1  | 0  | 0  |
| 6  | 0 | 0 | 0 | 2  | -9 | -3 | 13 | 23 | 2  | 0  | 1  | 0  |
| 7  | 0 | 0 | 0 | 3  | -5 | 0  | 9  | 15 | 1  | 0  | 0  | 1  |
| 8  | 0 | 0 | 0 | 3  | 1  | -6 | -3 | -3 | 3  | 0  | 0  | 0  |
| 9  | 0 | 0 | 0 | 0  | 0  | 3  | 1  | 2  | 3  | 0  | 0  | 0  |
| 10 | 0 | 0 | 1 | 1  | 0  | 0  | 2  | 3  | 1  | 0  | 0  | 0  |
| 11 | 0 | 1 | 0 | 0  | 3  | 0  | -5 | -8 | 0  | 0  | 0  | 0  |
| 12 | 0 | 0 | 0 | 0  | 3  | 2  | 1  | 0  | 3  | 0  | 0  | 0  |

Fig.12A

FOURTH STEP: 8CH

| | 0 | 1 | 2 | 8 | 9 | 10 | 16 | 17 | 18 | 24 | 25 | 26 |
|---|---|---|---|---|---|---|---|---|---|---|---|---|
| 1 | 0 | 0 | 0 | 0 | -6 | -6 | 3 | 6 | 1 | 0 | 0 | 0 |
| 2 | 1 | 0 | 0 | 1 | -6 | -9 | 2 | 5 | 2 | 0 | 0 | 0 |
| 3 | 0 | 0 | 0 | 0 | 6 | 5 | -3 | -4 | -1 | 0 | 0 | 0 |
| 4 | 0 | 0 | 0 | 0 | 7 | 14 | 0 | -2 | -4 | 0 | 0 | 0 |
| 5 | 0 | 0 | 0 | 0 | 5 | 4 | 1 | 0 | -1 | 1 | 0 | 0 |
| 6 | 0 | 0 | 0 | 0 | 3 | 15 | 9 | 13 | -2 | 0 | 1 | 0 |
| 7 | 0 | 0 | 0 | 0 | 13 | 27 | 3 | 0 | -5 | 0 | 0 | 1 |
| 8 | 0 | 0 | 0 | 0 | 19 | 21 | -9 | -18 | -3 | 0 | 0 | 0 |
| 9 | 0 | 0 | 0 | 0 | 0 | 3 | 1 | 2 | 3 | 0 | 0 | 0 |
| 10 | 0 | 0 | 1 | 0 | 6 | 9 | 0 | -2 | -1 | 0 | 0 | 0 |
| 11 | 0 | 1 | 0 | 0 | 3 | 0 | -5 | -8 | 0 | 0 | 0 | 0 |
| 12 | 0 | 0 | 0 | 0 | 3 | 2 | 1 | 0 | 3 | 0 | 0 | 0 |

Fig.12B

FIFTH STEP: 9CH

| | 0 | 1 | 2 | 8 | 9 | 10 | 16 | 17 | 18 | 24 | 25 | 26 |
|---|---|---|---|---|---|---|---|---|---|---|---|---|
| 1 | 0 | 0 | 0 | 0 | 0 | -2 | 5 | 6 | 7 | 0 | 0 | 0 |
| 2 | 1 | 0 | 0 | 1 | 0 | -5 | 4 | 5 | 8 | 0 | 0 | 0 |
| 3 | 0 | 0 | 0 | 0 | 0 | 1 | -5 | -4 | -7 | 0 | 0 | 0 |
| 4 | 0 | 0 | 0 | 0 | 0 | 28 | -7 | -8 | -33 | 0 | 0 | 0 |
| 5 | 0 | 0 | 0 | 0 | 0 | 2 | -2 | 0 | -18 | 3 | 0 | 0 |
| 6 | 0 | 0 | 0 | 0 | 0 | 13 | 8 | 13 | -5 | 0 | 1 | 0 |
| 7 | 0 | 0 | 0 | 0 | 0 | 55 | -4 | 0 | -54 | 0 | 0 | 3 |
| 8 | 0 | 0 | 0 | 0 | 0 | 25 | -46 | -54 | -66 | 0 | 0 | 0 |
| 9 | 0 | 0 | 0 | 0 | 0 | 3 | 1 | 2 | 3 | 0 | 0 | 0 |
| 10 | 0 | 0 | 1 | 0 | 0 | 5 | -2 | -2 | -7 | 0 | 0 | 0 |
| 11 | 1 | 0 | 0 | 0 | 3 | -2 | -6 | -8 | -3 | 0 | 0 | 0 |
| 12 | 0 | 0 | 0 | 0 | 0 | 2 | 1 | 0 | 3 | 0 | 0 | 0 |

Fig.13A

SIXTH STEP: 10CH

|   | 1 | 2 | 8 | 9 | 10 | 16 | 17 | 18 | 24 | 25 | 26 |
|---|---|---|---|---|----|----|----|----|----|----|----|
| 1 | 0 | 1 | 0 | 0 | 0 | -5 | -2 | -7 | 0 | 0 | 0 |
| 2 | 1 | 0 | 1 | 0 | 0 | -21 | -15 | -27 | 0 | 0 | 0 |
| 3 | 0 | 0 | 0 | 0 | 1 | -5 | -4 | -7 | 0 | 0 | 0 |
| 4 | 0 | 0 | 0 | 0 | 0 | 133 | 106 | 163 | 0 | 0 | 0 |
| 5 | 0 | 0 | 0 | 0 | 0 | 8 | 8 | -4 | 0 | 0 | 0 |
| 6 | 0 | 0 | 0 | 0 | 0 | 73 | 65 | 86 | 3 | 0 | 0 |
| 7 | 0 | 0 | 0 | 0 | 0 | 271 | 220 | 331 | 0 | 1 | 3 |
| 8 | 0 | 0 | 0 | 0 | 0 | 79 | 46 | 109 | 0 | 0 | 0 |
| 9 | 0 | 0 | 0 | 0 | 0 | 16 | 14 | 24 | 0 | 0 | 0 |
| 10 | 0 | 1 | 0 | 0 | 0 | 23 | 18 | 28 | 0 | 0 | 0 |
| 11 | 0 | 0 | 0 | 3 | 0 | -16 | -16 | -17 | 0 | 0 | 0 |
| 12 | 0 | 0 | 0 | 0 | 0 | 11 | 8 | 17 | 0 | 0 | 0 |

Fig.13B

SEVENTH STEP: 16CH

|  | 0 | 1 | 2 | 8 | 9 | 10 | 16 | 17 | 18 | 24 | 25 | 26 |
|---|---|---|---|---|---|---|---|---|---|---|---|---|
| 1 | 0 | 0 | 0 | 0 | 0 | 0 | 0 | 24 | -76 | 15 | 0 | 0 |
| 2 | 8 | 0 | 0 | 8 | 0 | 0 | 0 | 48 | -300 | 63 | 0 | 0 |
| 3 | 0 | 0 | 0 | 0 | 0 | 8 | 0 | 8 | -76 | 15 | 0 | 0 |
| 4 | 0 | 0 | 0 | 0 | 0 | 0 | 0 | -216 | 1836 | -399 | 0 | 0 |
| 5 | 0 | 0 | 0 | 0 | 0 | 0 | 8 | 8 | -4 | 3 | 0 | 0 |
| 6 | 0 | 0 | 0 | 0 | 0 | 0 | 0 | -64 | 980 | -219 | 8 | 0 |
| 7 | 0 | 0 | 0 | 0 | 0 | 0 | 0 | -408 | 3732 | -813 | 0 | 24 |
| 8 | 0 | 0 | 0 | 0 | 0 | 0 | 0 | -264 | 1188 | -237 | 0 | 0 |
| 9 | 0 | 0 | 0 | 0 | 0 | 0 | 0 | -2 | 32 | -6 | 0 | 0 |
| 10 | 0 | 0 | 8 | 0 | 0 | 0 | 0 | -40 | 316 | -69 | 0 | 0 |
| 11 | 0 | 1 | 0 | 0 | 24 | 0 | 0 | 0 | -25 | 6 | 0 | 0 |
| 12 | 0 | 0 | 0 | 0 | 0 | 0 | 0 | -24 | 180 | -33 | 0 | 0 |

Fig.14A

EIGHTH STEP: 17CH

|  | 0 | 1 | 2 | 8 | 9 | 10 | 16 | 17 | 18 | 24 | 25 | 26 |
|---|---|---|---|---|---|---|---|---|---|---|---|---|
| 1 | 8 | 0 | 0 | 0 | 0 | 0 | 0 | 0 | 308 | -57 | 0 | 0 |
| 2 | 0 | 0 | 0 | 8 | 0 | 0 | 0 | 0 | 468 | -81 | 0 | 0 |
| 3 | 0 | 0 | 0 | 0 | 0 | 8 | 0 | 0 | 52 | -9 | 0 | 0 |
| 4 | 0 | 0 | 0 | 0 | 0 | 0 | 0 | 0 | -1620 | 249 | 0 | 0 |
| 5 | 0 | 0 | 0 | 0 | 0 | 0 | 8 | 0 | 124 | -21 | 0 | 0 |
| 6 | 0 | 0 | 0 | 0 | 0 | 0 | 0 | 0 | -44 | -27 | 8 | 0 |
| 7 | 0 | 0 | 0 | 0 | 0 | 0 | 0 | 0 | -2796 | 411 | 0 | 24 |
| 8 | 0 | 0 | 0 | 0 | 0 | 0 | 0 | 0 | -3036 | 555 | 0 | 0 |
| 9 | 0 | 0 | 8 | 0 | 0 | 0 | 0 | -2 | 32 | -6 | 0 | 0 |
| 10 | 0 | 1 | 0 | 0 | 24 | 0 | 0 | 0 | -324 | 51 | 0 | 0 |
| 11 | 0 | 0 | 0 | 0 | 0 | 0 | 0 | 0 | -25 | 6 | 0 | 0 |
| 12 | 0 | 0 | 0 | 0 | 0 | 0 | 0 | 0 | -204 | 39 | 0 | 0 |

Fig.14B

NINTH STEP: 18CH  
ELEVENTH STEP: 25CH  
TENTH STEP: 24CH

| | 0 | 1 | 2 | 8 | 9 | 10 | 16 | 17 | 18 | 24 | 25 | 26 |
|---|---|---|---|---|---|---|---|---|---|---|---|---|
| 1 | 352 | 0 | 0 | 0 | 0 | 0 | 0 | 0 | 0 | -10824 | 2664 | 0 |
| 2 | 0 | 0 | 0 | 352 | 0 | 0 | 0 | 0 | 0 | -16200 | 3744 | 0 |
| 3 | 0 | 0 | 0 | 0 | 0 | 352 | 0 | 0 | 0 | -1800 | 416 | 0 |
| 4 | 0 | 0 | 0 | 0 | 0 | 0 | 0 | 0 | 0 | 54696 | -12960 | 0 |
| 5 | 0 | 0 | 0 | 0 | 0 | 0 | 352 | 0 | 0 | -4272 | 992 | 0 |
| 6 | 0 | 0 | 0 | 0 | 0 | 0 | 0 | 0 | -44 | -27 | 8 | 0 |
| 7 | 0 | 0 | 0 | 0 | 0 | 0 | 0 | 0 | 0 | 93576 | -22368 | 1056 |
| 8 | 0 | 0 | 0 | 0 | 0 | 0 | 0 | 0 | 0 | 106392 | -24288 | 0 |
| 9 | 0 | 0 | 352 | 0 | 0 | 0 | 0 | -88 | 0 | -1128 | 256 | 0 |
| 10 | 0 | 0 | 0 | 0 | 0 | 0 | 0 | 0 | 0 | 10992 | -2592 | 0 |
| 11 | 0 | 44 | 0 | 0 | 0 | 0 | 0 | 0 | 0 | 939 | -200 | 0 |
| 12 | 0 | 0 | 0 | 0 | 1056 | 0 | 0 | 0 | 0 | 7224 | -1632 | 0 |

Fig.15A

TENTH STEP: 24CH

| 0 | 1 | 2 | 8 | 9 | 10 | 16 | 17 | 18 | 24 | 25 | 26 |
|---|---|---|---|---|---|---|---|---|---|---|---|
| 19252992 | 0 | 0 | 0 | 0 | 0 | 0 | 0 | 0 | 0 | -5508096 | 0 |
| 0 | 0 | 19252992 | 0 | 0 | 0 | 0 | 0 | 0 | 0 | -5170176 | 0 |
| 0 | 0 | 0 | 0 | 0 | 19252992 | 0 | 0 | 0 | 54696 | -574464 | 0 |
| 0 | 0 | 0 | 19252992 | 0 | 0 | 0 | 0 | 0 | 0 | -12960 | 0 |
| 0 | 0 | 0 | 0 | 0 | 0 | 19252992 | 0 | 0 | 0 | -11106688 | 0 |
| 0 | 0 | 0 | 0 | 0 | 0 | 0 | 0 | -2406624 | 0 | 87648 | 0 |
| 0 | 0 | 0 | 0 | 0 | 0 | 0 | -4813248 | 0 | 0 | -10695168 | 57758976 |
| 0 | 0 | 0 | 0 | 0 | 0 | 0 | 0 | 0 | 0 | 50383872 | 0 |
| 0 | 0 | 0 | 0 | 0 | 0 | 0 | 0 | 0 | 0 | -616704 | 0 |
| 0 | 0 | 0 | 0 | 0 | 0 | 0 | 0 | 0 | 0 | 684288 | 0 |
| 0 | 2406624 | 0 | 0 | 0 | 0 | 0 | 0 | 0 | 0 | 1230240 | 0 |
| 0 | 0 | 0 | 0 | 57758976 | 0 | 0 | 0 | 0 | 0 | 4359168 | 0 |

Fig.15B

ELEVENTH STEP: 25CH

| 0 | 1 | 2 | 8 | 9 | 10 | 16 | 17 | 18 | 24 | 25 | 26 |
|---|---|---|---|---|---|---|---|---|---|---|---|
| 9.7004E+14 | 0 | 0 | 0 | 0 | 0 | 0 | 0 | 0 | 0 | 0 | 0 |
| 0 | 0 | 9.7004E+14 | 0 | 0 | 0 | 0 | 0 | 0 | 0 | 0 | 0 |
| 0 | 0 | 0 | 0 | 0 | 9.7004E+14 | 0 | 0 | 0 | 0 | 0 | 0 |
| 0 | 0 | 0 | 9.7004E+14 | 0 | 0 | 0 | 0 | 0 | 0 | 0 | 0 |
| 0 | 0 | 0 | 0 | 0 | 0 | 9.7004E+14 | 0 | 0 | 0 | 0 | 0 |
| 0 | 0 | 0 | 0 | 0 | 0 | 0 | 0 | -1.21255E+14 | 0 | 0 | 0 |
| 0 | 0 | 0 | 0 | 0 | 0 | 0 | -2.4251E+14 | 0 | 0 | 0 | 0 |
| 0 | 0 | 0 | 0 | 0 | 0 | 0 | 0 | 0 | 2.7558E+12 | 0 | 0 |
| 0 | 0 | 0 | 0 | 0 | 0 | 0 | 0 | 0 | 0 | 50383872 | 0 |
| 0 | 0 | 0 | 0 | 0 | 0 | 0 | 0 | 0 | 0 | 0 | 2.91012E+15 |
| 0 | 1.21255E+14 | 0 | 0 | 0 | 0 | 0 | 0 | 0 | 0 | 0 | 0 |
| 0 | 0 | 0 | 0 | 2.91012E+15 | 0 | 0 | 0 | 0 | 0 | 0 | 0 |

Fig.16

COEFFICIENT→1

|    | 0 | 1 | 2 | 8 | 9 | 10 | 16 | 17 | 18 | 24 | 25 | 26 |
|----|---|---|---|---|---|----|----|----|----|----|----|----|
| 1  | 1 | 0 | 0 | 0 | 0 | 0  | 0  | 0  | 0  | 0  | 0  | 0  |
| 2  | 0 | 0 | 0 | 1 | 0 | 0  | 0  | 0  | 0  | 0  | 0  | 0  |
| 3  | 0 | 0 | 0 | 0 | 0 | 1  | 0  | 0  | 0  | 0  | 0  | 0  |
| 4  | 0 | 0 | 0 | 0 | 0 | 0  | 0  | 0  | 0  | 1  | 0  | 0  |
| 5  | 0 | 0 | 0 | 0 | 0 | 0  | 1  | 0  | 0  | 0  | 0  | 0  |
| 6  | 0 | 0 | 0 | 0 | 0 | 0  | 0  | 0  | 1  | 0  | 0  | 0  |
| 7  | 0 | 0 | 0 | 0 | 0 | 0  | 0  | 0  | 0  | 0  | 0  | 1  |
| 8  | 0 | 0 | 0 | 0 | 0 | 0  | 0  | 0  | 0  | 0  | 1  | 0  |
| 9  | 0 | 0 | 0 | 0 | 0 | 0  | 0  | 1  | 0  | 0  | 0  | 0  |
| 10 | 0 | 0 | 1 | 0 | 0 | 0  | 0  | 0  | 0  | 0  | 0  | 0  |
| 11 | 0 | 1 | 0 | 0 | 0 | 0  | 0  | 0  | 0  | 0  | 0  | 0  |
| 12 | 0 | 0 | 0 | 0 | 1 | 0  | 0  | 0  | 0  | 0  | 0  | 0  |

Fig.18

| CH NUMBER | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 1 | D | D | D | EC | D | D | D | EC | D | D | D | EC | D | D | D | EC | D | D | D | EC | D | D | D | EC | D | D | D | EC | D | D | D | EC |
| 2 | D | D | D | EC | D | D | D | EC | D | D | D | EC | D | D | D | EC | D | D | D | EC | D | D | D | EC | D | D | D | EC | D | D | D | EC |
| 3 | D | D | D | D | D | D | D | D | D | D | D | D | D | D | D | D | D | D | D | D | D | D | D | D | D | D | D | D | D | D | D | D |
| 4 | D | D | D | D | D | D | D | D | D | D | D | D | D | D | D | D | D | D | D | D | D | D | D | D | D | D | D | D | D | D | D | D |
| 5 | D | D | D | D | D | D | D | D | D | D | D | D | D | D | D | D | D | D | D | D | D | D | D | D | D | D | D | D | D | D | D | D |
| 6 | D | D | D | D | D | D | D | D | D | D | D | D | D | D | D | D | D | D | D | D | D | D | D | D | D | D | D | D | D | D | D | D |
| 7 | D | D | D | D | D | D | D | D | D | D | D | D | D | D | D | D | D | D | D | D | D | D | D | D | D | D | D | D | D | D | D | D |

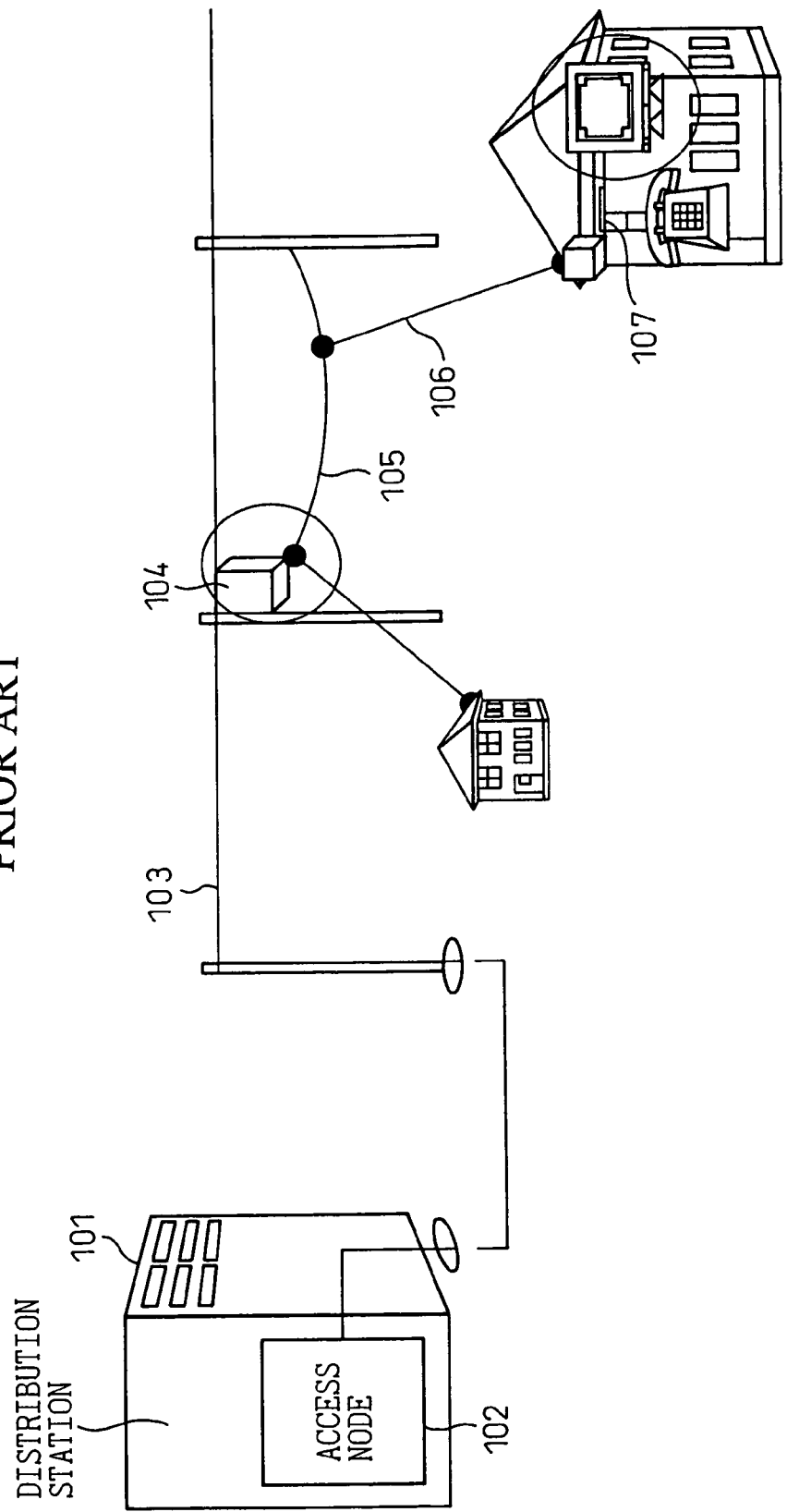

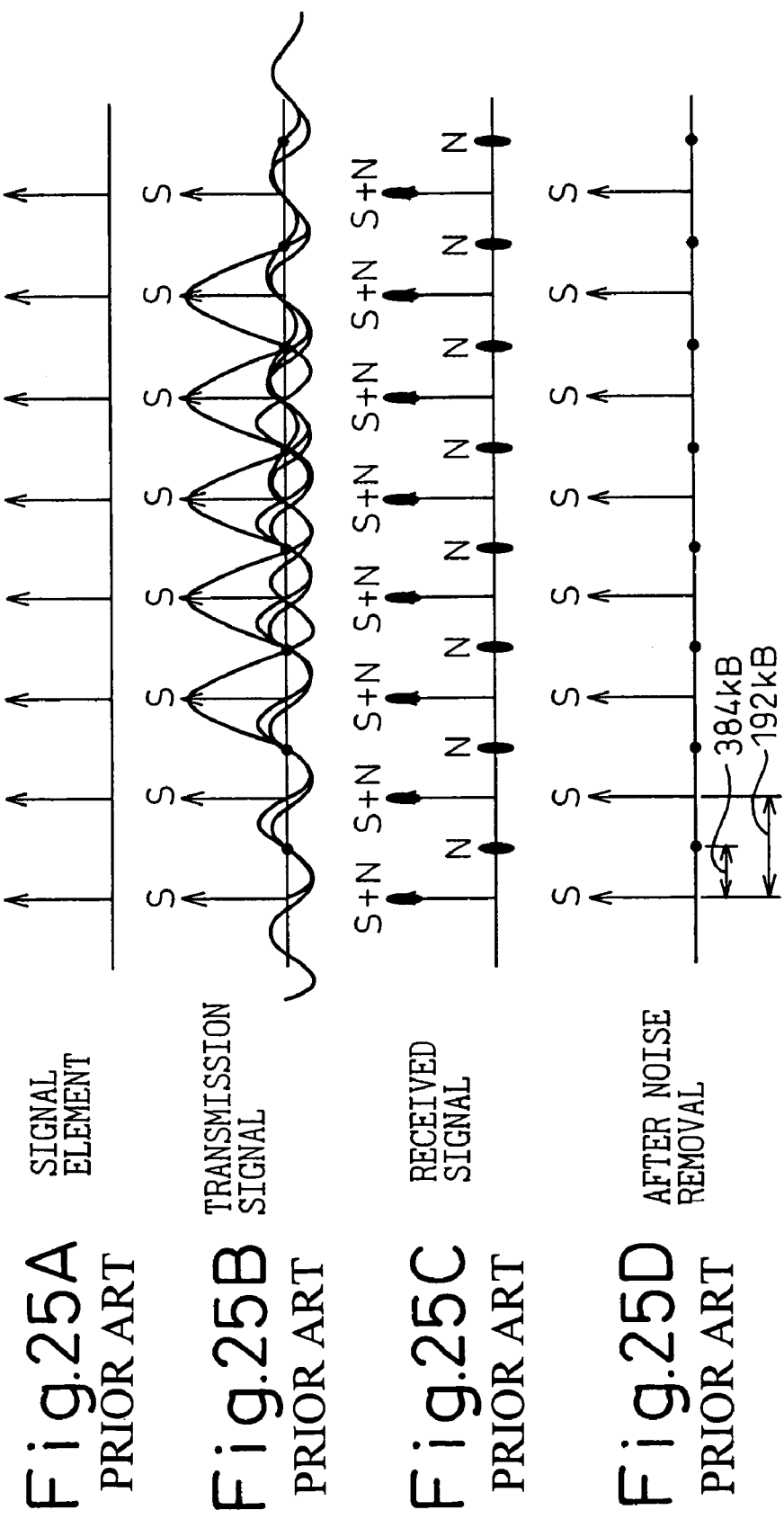

ERROR CORRECTION DEVICE AND ERROR CORRECTION METHOD

BACKGROUND OF THE INVENTION

1. Field of the Invention

The present invention relates to an error correction device and an error correction method for correcting errors in data items sent on a plurality of channels.

According to the present invention, data items sent on a plurality of channels refer to data items to be handled in diverse fields such as: the field of the asymmetric digital subscriber line (ADSL) and symmetric digital subscriber line (SDSL) technologies that utilize wire communication as a transmission medium; the field of the orthogonal frequency division multiplexing (OFDM) technology that utilizes radiocommunication as a transmission medium; the field of the wavelength division multiplexing (WDM) technology that utilizes an optical fiber as a transmission medium and adopts light having a plurality of wavelengths; and the field of the technology for performing parallel recording or reproducing of data using a recording medium.

2. Description of the Related Art

Various types of data transmission systems are already known. For example, transmission systems utilizing a power line as a data transmission line are also known. FIG. 22 shows a power line carrier communication system that is one type of transmission system utilizing the power line. There are shown a distribution substation 101, an access node 102, a high-tension distribution line 103, a pole transformer 104, a low-tension distribution line 105, a drop wire 106, and house wiring 107.

A high ac voltage of, for example, 6.6 kV is distributed from the distribution substation 101 to each pole transformer 104 over the high-tension distribution line 103. The high voltage is stepped down to 100 V or 200 V and is supplied to households or any other users. This causes various kinds of electric equipment coupled to the house wiring 107 or various kinds of electric equipment plugged into outlets to start operating.

The access node 102 installed in the distribution substation 101 and a modem (not shown) incorporated in the pole transformer 104 are linked by an optical fiber transmission line (not shown). The optical fiber transmission line is generally laid along the high-tension distribution line 103. The modem in the pole transformer 104 transforms a light signal into an electric signal or vice versa. The low-tension distribution line 105, drop wire 106, and house wiring 107 are used as a data transmission line for wire communication. Once a terminal is plugged into an outlet coupled to the house wiring 107, a power line carrier communication system, called a "Last One Mile" system, can be constructed for communication of data between the access node 102 and the terminal.

In this kind of power line carrier communication system, the low-tension distribution line 105 offers an inductive impedance to the flow of an alternating current from the modem in the pole transformer 104, and the drop wire 106 and house wiring 107 offer a capacitive impedance thereto. Moreover, various kinds of electric equipment coupled to the house wiring 107 generally have an anti-noise capacitor incorporated therein. Therefore, the impedance to the flow of an alternating current from the modem in the pole transformer 104 includes a relatively large inductive reactance and a large capacitive reactance.

Consequently, for the modem in the pole transformer 104, the low-tension distribution line 105 is comparable to a low-pass filter. A signal received by a modem coupled to the house wiring 107 has the high-frequency components thereof reduced greatly. Namely, the high-frequency components of the received signal are buried under noise. Moreover, the low-frequency components of the received signal do not decay as much as the high-frequency components do. A random noise sent from a switching power supply or an inverter circuit incorporated in electric equipment is delivered to largely affect the received signal.

For example, referring to FIG. 23A, the axis of the ordinate indicates power levels PWR and the axis of the abscissa indicates frequencies. A dot-line curve expresses a noise-canceling characteristic, and solid-line curves indicate received signal levels and noise levels. By utilizing the noise-canceling characteristic expressed with the dot-line curve, the noise level of low-frequency components can be made lower than the received signal level. However, as far as electric equipment employing an inverter is concerned, noise having a comb-like wave are often distributed over a broad frequency band. In this case, for example, as shown in FIG. 23B, high noise levels are detected outside a noise-canceling band. This leads to the frequent occurrence of errors in the received data.

The orthogonal frequency division multiplexing (OFDM) technique is one of the techniques for transmitting data using multiple carriers. The carriers are orthogonal to one another. Multiplexing is performed using the multiple carriers. It is therefore possible to assign frequencies, which do not fall within frequency bands causing high noise levels, to the carriers. The discrete multitone (DMT) technique is one of the techniques for transmitting data using a plurality of carriers, and is adopted as a modulating technique to be adapted to the asymmetric digital subscriber line (ADSL) technique.

FIG. 24 is an explanatory diagram concerning a data transmission device proposed previously. The data transmission device is equivalent to the modem that is included in the aforesaid power line carrier communication system and connected to the house wiring in order to transmit or receive data. Referring to FIG. 24, there is shown a code converter 111 having a scrambling (SCR) capability, a series-to-parallel (S/P) conversion capability, a Gray code-to-natural binary (G/N) conversion capability, and a finite sum arithmetic capability.

There are also shown a signal element generation unit 112, an inverse fast Fourier transform (IFFT) unit 113 having a guard time GT addition capability, a zero element insertion unit 114, a rolloff filter (ROF) 115, a modulator (MOD) 116, a digital-to-analog (D/A) converter 117, a low-pass filter (LPF) 118, a transmission clock generation unit (TX-CLK) 119, a transmission line (TX-line), and a reception line (RX-line). Moreover, there are shown a band-pass filter (BPF) 120, an analog-to-digital (A/D) converter 121, a demodulator (DEM) 122, a rolloff filter (ROF) 123, a reception clock distribution unit (RX-CLK), a timing sample unit (TIM) 125. Furthermore, there are shown a phase locked loop (PLL) 126 including a voltage-controlled crystal oscillator (VCXO), a noise removing unit 127, a fast Fourier transform (FFT) unit 128 having a guard time (GT) deletion capability, a signal identification unit (DEC) 129, and a code converter 130 having a difference arithmetic capability, a natural binary-to-Gray code (N/G) conversion capability, a parallel-to-series (P/S) conversion capability, and a de-scrambling (DSCR) capability. Moreover, a transmission signal SD and a reception signal RD are also shown.

A clock pulse generated by the transmission clock generation unit 119 is applied to the circuit elements. To the zero element insertion unit 114, the clock pulse is applied as a timing signal that determines the timing of inserting a zero element. The code converter 111 scrambles the transmission signal SD, and converts it into the same number of frequency components as the number of carriers so that the frequency components will be transmitted in parallel with one another. Moreover, the code converter 111 converts the number system adopted for the transmission signal SD converted from the Gray code into the natural binary. Moreover, the code converter 111 performs finite sum arithmetic so that a receiving side can perform difference arithmetic. Thereafter, the signal element generation unit 112 gives a Nyquist interval to the signal elements. The inverse FFT unit 113 adds a guard time GT to the resultant signal and performs inverse FFT on the signal. The zero element insertion unit 114 inserts zero elements having a zero level according to the timing signal that determines the timing of inserting zero elements. The rolloff filter 115 re-shapes the waveform of the signal. The modulator 116 digitally modulates the signal. The D/A converter 117 converts the signal into an analog form. The low-pass filter 118 places low-frequency components, which fall within a transmission band ranging, for example, 10 kHz to 450 kHz, on the transmission line TX-line. In this case, the transmission line TX-line and reception line RX-line are linked with the house wiring and coupling filters between them.

The reception clock distribution unit 124 distributes a clock pulse, which is produced based on a clock pulse sent from the phase locked loop 126, to the circuit elements. A signal received over the reception line RX-line has the frequency components thereof, which fall within, for example, a range from 10 kHz to 450 kHz, passed through the bandpass filter 120. The A/D converter 121 digitizes the signal. The demodulator 122 demodulates the signal. The rolloff filter 123 re-shapes the waveform of the signal. The noise removing unit 127 detects the noise levels of noises superposed on zero elements according to the clock pulse sent from the reception clock distribution unit 124, interpolates the noise levels to calculate the noise level of a noise superposed on a signal element, and removes the noise from the signal element. The FFT unit 128 deletes the guard time GT, and transforms the signal from the time domain into the frequency domain. The signal element identification unit 129 identifies the signal. The code converter 130 performs parallel-to-series conversion, de-scrambling, difference arithmetic, and natural binary-to-Gray code conversion so as to produce the reception signal RD.

FIGS. 25A to 25D are explanatory diagrams concerning a zero element inserted by the zero element insertion unit 114 shown in FIG. 24, and noise removal. Referring to FIGS. 25A to 25D, the transmission speed for signal elements S (25A) shall be 192 kB, and zero elements indicated with black dots are inserted into a transmission signal (25B). By copying one bit, one zero element can be equivalently inserted between signal elements S. The insertion of zero elements doubles the transmission speed to 384 kB. A received signal (25C) has a noise N superposed on the signal elements S and zero elements respectively during transmission. The noise N superposed on the zero elements is sampled. As the same noise as the sampled noise N is superposed on the signal elements, the noise N is removed from the signal elements. Consequently, a reception signal or a signal resulting from noise removal (25D) can be restored.

Incidentally, the insertion of zero elements is such that one zero element may be inserted among a plurality of signal elements or a plurality of zero elements may be inserted between signal elements. For example, when two zero elements are inserted between signal elements, if raw data falls within a frequency band of 128 kHz wide, the frequency band is expanded to be 384 kHz wide.

Generally, an error correcting means for data appends an error correcting code to data, and detects, based on the error correcting code, if an error has occurred in the data. If an error has occurred, the error is corrected. However, since the error correcting code is composed of a plurality of bits, the appending of the error correcting code may lead to the deterioration of the efficiency in high-speed transmission. This poses a problem.

Moreover, as mentioned above, when the means for inserting zero components, sampling a noise superposed on the zero components, and canceling a noise superposed on signal components according to the sampled noise is adapted in the power line carrier communication system, high-speed transmission can be achieved with the adverse effect of noises minimized. However, the distribution of noise is, as shown in FIG. 23B, observed over a plurality of frequency bands, and the noise levels thereof are relatively high. Moreover, the noise levels and frequency bands often vary time-sequentially. Consequently, the noise components cannot be removed reliably. This leads to occurrence of errors in identifying data.

When multilevel modulation is adopted, the modulated signal elements of a received signal vary greatly due to the adverse effect of noises. An error in identifying data occurs frequently. This poses a problem in that it is hard to increase the number of signal levels to be modulated through multilevel modulation that enables high-speed transmission.

SUMMARY OF THE INVENTION

Accordingly, an object of the present invention is to effectively correct errors by transmitting data at a high speed with a plurality of channels assigned to the data, and using at least one channel for error correction.

An error correction device in accordance with the present invention will be described with reference to FIG. 3. The error correction device corrects errors in data items sent on a plurality of channels. At least one of the plurality of channels is used as an error correction channel. An identification unit 29 calculates the exclusive OR of data items sent on the other channels, adopts the calculated exclusive OR as data sent on the error correction channel, and thus identifies the data items sent on the plurality of channels. An exclusive OR unit 37 calculates the exclusive OR of the identified data items sent on the plurality of channels. A signal quality detection unit 38 detects the signal qualities concerning the plurality of channels. If an output of the exclusive OR unit 37 is a predetermined specific value such as 0, an identifying and processing unit 39 provides the identified data items sent on the channels other than the error correction channel as they are. If the output of the exclusive OR unit 37 is not the predetermined specific value such as 0, the identifying and processing unit 39 replaces the identified data item, which is sent on the channel whose signal quality is detected to be the worst by the signal quality detection unit 38, with the exclusive OR of the identified data items sent on the channels other than the channel whose signal quality is the worst. The identifying and processing unit 39 then provides the resultant data. An error correction device may include the identification unit 29, exclusive OR unit 37, signal quality detection unit 38, and identifying and processing unit 39.

Otherwise, channels are associated with the sides of each surface of a regular polyhedron. A channel associated with one side of each surface of the regular polyhedron is used as an error correction channel. An identification unit 29 calculates the exclusive OR of data items sent on channels associated with the remaining sides of each surface, adopts the calculated exclusive OR as data sent on the error correction channel, and thus identifies the data items sent on the plurality of channels. An exclusive OR unit 37 calculates the exclusive OR of identified data items sent on the error correction channel and the other channels associated with the same surface as the error correction channel is. A signal quality detection unit 38 detects the signal qualities concerning the plurality of channels that is associated with the sides of the surface and grouped together. If an output of the exclusive OR unit that calculates the exclusive OR of data items sent on channels associated with a surface is a predetermined specific value such as 0, an identifying and processing unit 39 provides the identified data items, which is sent on the channels other than the error correction channel associated with the same surface as the channels are, as they are. If the output of the exclusive OR unit is not the predetermined specific value such as 0, the identifying and processing unit 39 replaces the identified data, which is sent on the channel whose signal quality is detected to be the worst by the signal quality detection unit 38, with the exclusive OR of the identified data items sent on the channels other than the channel whose signal quality is the worst. The identifying and processing unit 39 then provides the resultant data. An error correction device in accordance with the present invention may include the exclusive OR unit 37, signal quality detection unit 38, and identifying and processing unit 39.

Otherwise, channels are associated with the sides of each surface of a regular polyhedron. Channels associated with the sides of a surface of the regular polyhedron and with the sides of a plurality of surfaces adjoining the surface are grouped together. If the exclusive OR of identified data items sent on the channels associated with a surface is not a predetermined specific value such as 0, an identifying and processing unit regards the same number of channels as the number of surfaces of the regular polyhedron, of which signal qualities are detected to have deteriorated by the signal quality detection unit, as error channels. The identifying and processing unit then solves simultaneous equations whose unknowns are data items assigned the error channels so as to thus correct the data items sent on the error channels. An error correction device in accordance with the present invention may include the identifying and processing unit.

Otherwise, each of a plurality of channels is assigned to a plurality of bits. One bit or a plurality of bits out of the plurality of bits is manipulated as a subset. The plurality of channels is grouped in units of a predetermined number of channels. One channel of each group is used as an error correction channel. An exclusive OR unit calculates the exclusive OR of subsets sent on the channels other than the error correction channel, adopts the calculated exclusive OR as a subset sent on the error correction channel, and thus identifies the data items sent on the plurality of channels. The exclusive OR unit then calculates the exclusive OR of the identified data items of the subsets sent on the channels belonging to a group. A signal quality detection unit detects the signal qualities concerning channels belonging to the group according to the subsets. If an output of the exclusive OR unit is a predetermined specific value such as 0, an error correction unit provides the identified data items of the subsets, which are sent on the channels other than the error correction channel, as they are. If the output of the exclusive OR unit is not the predetermined value such as 0, the error correction unit replaces the identified data, which is sent on the channel whose signal quality is detected to be the worst by the signal quality detection unit, with the exclusive OR of the identified data items of the subsets sent on the channels other than the channel whose signal quality is the worst. The error correction unit then provides the resultant data. An identification unit identifies bits other than the subsets, and provides the identified bits together with the subsets whose errors have been corrected by the error correction unit. An error correction device in accordance with the present invention may include the exclusive OR unit, a signal quality detection unit, an error correction unit, and an identification unit.

Next, an error correction method in accordance with the present invention will be described below. Herein, at least one channel out of a plurality of channels is used as an error correction channel. At an identification step, the exclusive OR of data items sent on the remaining channels other than the error correction channel is calculated and adopted as data sent on the error correction channel. Thus, the data items sent on the plurality of channels are identified. At a detection step, a signal quality detection unit or the like detects the signal qualities concerning channels according to the identified data items. At an exclusive-OR step, an exclusive OR unit calculates the exclusive OR of the identified data items sent on the plurality of channels. At an output step, if the calculated exclusive OR is a predetermined specific value such as 0, the identified data items sent on the channels other than the error correction channel are provided as they are. If the exclusive OR is not the predetermined specific value such as 0, the data sent on the channel whose signal quality is detected to be the worst as a result of detecting the signal qualities concerning the plurality of channels is replaced with the exclusive OR of the identified data items sent on the channels other than the channel. The resultant data is then provided. An error correction method according to the present invention may include the identification step, a detection step, an exclusive-OR step, and an output step.

Otherwise, channels are associated with the sides of each surface of a regular polyhedron, and a channel associated with one side of each surface of the regular polyhedron is used as an error correction channel. At an identification step, the exclusive OR of data items sent on channels associated with the remaining sides of each surface is calculated and adopted as data sent on the error correction channel. Thus, the data items sent on the plurality of channels are identified. At a detection step, the signal qualities concerning channels are detected based on the identified data items. At an output step, if the exclusive OR of identified data items sent on the channels associated with a surface is a predetermined specific value such as 0, the identified data items sent on the channels other than the error correction channel associated with the same surface as the channels are provided as they are. If the exclusive OR is not the predetermined specific value such as 0, the identified data sent on the channel whose signal quality is detected to be the worst as a result of detecting the signal qualities concerning the channels is replaced with the exclusive OR of the identified data items sent on the other channels other than the channel. Then, the error-corrected data is provided. An error correction method in accordance with the present invention may include the identification step, a detection step, and an output step.

Otherwise, channels are associated with the sides of each surface of a regular polyhedron. Channels associated with the sides of each surface of the regular polyhedron and with the sides of a plurality of surfaces adjoining the surface are grouped together. At a correction step, if the exclusive OR of identified data sent on channels associated with a surface is not a predetermined specific value such as 0, the same number of channels as the number of surfaces of the regular polyhedron, of which signal qualities are found to have deteriorated as a result of detecting the signal qualities concerning the channels, are regarded as error channels. Simultaneous equations whose unknowns are data items assigned to the error channels are solved in order to thus correct the data items sent on the error channels. Otherwise, if the exclusive OR of identified data items sent on the channels associated with a surface of the regular polyhedron is not the predetermined specific value such as 0, the same number of channels as the number of surfaces of the regular polyhedron, of which signal qualities are found to have deteriorated as a result of detecting the signal qualities concerning channels, are regarded as error channels. A coefficient assigned to the error channel associated with a surface is set to 1. The other error channel associated surfaces are successively selected, and the coefficients assigned to the channels are set to 0. Finally, coefficients assuming any values other than 0 are detected, and channels assigned the coefficients are regarded as channels on which an error has occurred. The errors are then corrected. An error correction method in accordance with the present invention may include the correcting step.

Otherwise, a signal to which each of a plurality of channels is assigned is composed of a plurality of bits. One bit or a plurality of bits out of the plurality of bits is manipulated as a subset. At least one of the plurality of channels is used as an error correction channel. At an exclusive OR step, the exclusive OR of subsets sent on the other channels is calculated and adopted as a subset sent on the error correction channel. Thus, the data items sent on the plurality of channels are identified. The exclusive OR of the data items of the subsets is calculated. At a detection step, the signal qualities concerning the channels are detected based on the subsets. At an output step, if the calculated exclusive OR is a predetermined specific value such as 0, the identified data items of the subsets sent on the channels other than the error correction channel are provided as they are. If the calculated exclusive OR is not the predetermined specific value such as 0, the identified data sent on the channel whose signal quality is found to be the worst as a result of detecting the signal qualities concerning channels is replaced with the calculated exclusive OR of the identified data items of the subsets sent on the channels other than the channel whose signal quality is the worst. The resultant data is then provided. At an identification step, bits other than the subsets are identified and provided together with the subsets. Otherwise, a plurality of channels is divided into a plurality of groups, and one channel out of each group is used as an error correction channel. At an error correction step, the exclusive OR of subsets sent on the channels other than the error correction channel belonging to each group is calculated and adopted as a subset sent on the error correction channel. An error in the subset sent on the channel whose signal quality is found to be the worst as a result of detecting the signal qualities concerning the channels of each group is corrected based on the identified data items of the subset. An error correction method in accordance with the present invention may include the exclusive OR step, a detection step, an output step, an identification step, and an error correction step.

BRIEF DESCRIPTION OF THE DRAWINGS

FIG. 1 is an explanatory diagram concerning an embodiment of the present invention;

FIG. 2 is an explanatory diagram concerning an error correction and data production unit employed in the embodiment of the present invention;

FIG. 3 is an explanatory diagram concerning an error correction unit employed in the embodiment of the present invention;

FIG. 6 is an explanatory diagram concerning the relationship between surface numbers assigned to the surfaces of a regular dodecahedron and channels which is employed in the embodiment of the present invention;

FIGS. 7A to 7B are explanatory diagrams concerning grouping of each surface and surrounding surfaces which is employed in the embodiment of the present invention;

FIG. 8 is an explanatory diagram concerning assignment of coefficient values;

FIG. 9 is an explanatory diagram concerning simultaneous occurrence of errors on twelve channels;

FIGS. 10A to 10B are explanatory diagrams concerning channels on which an error has occurred and the first step;

FIGS. 11A to 11B are explanatory diagrams concerning the second step and the third step;

FIGS. 12A to 12B are explanatory diagrams concerning the fourth step and the fifth step;

FIGS. 13A to 13B are explanatory diagrams concerning the sixth step and the seventh step;

FIGS. 14A to 14B are explanatory diagrams concerning the eighth step and the ninth step;

FIGS. 15A to 15B are explanatory diagrams concerning the tenth step and the eleventh step;

FIG. 16 is an explanatory diagram concerning the twelfth step;

FIG. 18 is an explanatory diagram concerning error correction performed on subsets according to an embodiment of the present invention;

FIG. 22 is an explanatory diagram concerning a power line carrier communication system;

FIGS. 25A to 25D are explanatory diagrams concerning zero element insertion and noise removal.

DESCRIPTION OF THE PREFERRED EMBODIMENTS

Figure 4A:
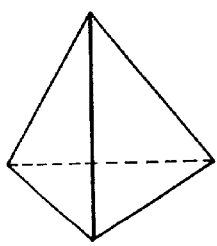
FIGS. 4A to 4E are explanatory diagrams concerning a regular polyhedron.
Figure 4B:
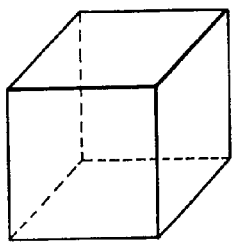
Figure 4C:
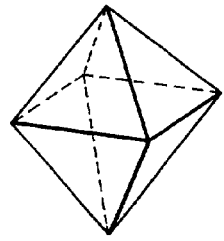
Figure 4D:
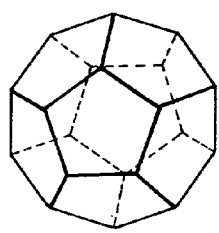
Figure 4E:
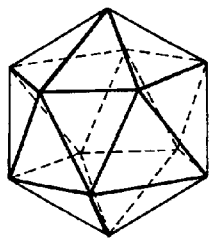

FIG. 1 is an explanatory diagram of an embodiment of the present invention. The present invention is adapted to the data transmission device included in the power line carrier communication system shown in FIG. 22. There are shown an error correction and data production unit 10 and a code converter 11 having a scrambling (SCR) capability, a series-to-parallel (S/P) conversion capability, a Gray code-to-natural binary (G/N) conversion capability, and a finite sum arithmetic capability. Moreover, there are shown a signal element generation unit 12, an inverse fast Fourier transform (IFFT) unit 13 having a guard time GT addition capability, a zero element insertion unit 14, a rolloff filter (ROF) 15, a modulator (MOD) 16, a D/A converter (D/A) 17, a low-pass filter (LPF) 18, and a transmission clock generation unit (TX-CLK) 19. A transmission line TX-line and a reception line RX-line are also shown.

Moreover, there are shown a bandpass filter (BPF) 20, an A/D converter (A/D) 21, a demodulator (DEM) 22, a rolloff filter (ROF) 23, a reception clock distribution unit (RX-CLK) 24, a timing sample unit (TIM) 25, a noise removing unit 27, and a fast Fourier transform (FFT) unit 28 having a guard time GT deletion capability. Moreover, there are a signal identification unit (DEC) 29 and a code converter 30 having a difference arithmetic capability, a natural binary-to-Gray code (N/G) conversion capability, a parallel-to-series (P/S) conversion capability, and a de-scrambling (DSCR) capability. Moreover, there are shown an error correction unit 31, a signal quality detection unit 32, a transmission signal SD, and a reception signal RD.

Figure 24:
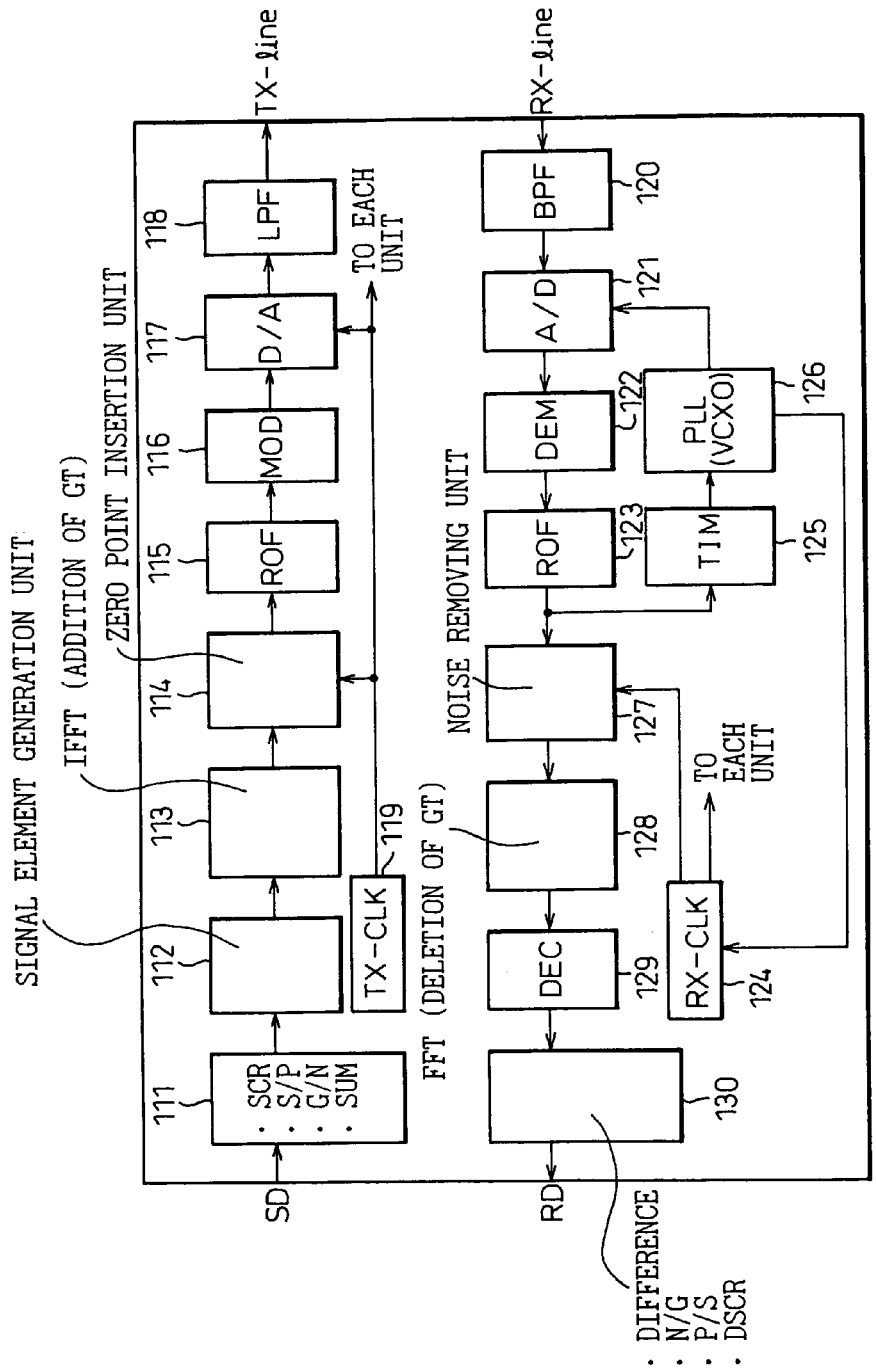
FIG. 24 is an explanatory diagram concerning a previously proposed data transmission device.

According to the present embodiment, the error correction and data production unit 10, error correction unit 31, and signal quality detection unit 32 are added to the data transmission device shown in FIG. 24. The inclusion of the error correction unit 31 and signal quality detection unit 32 realizes the capability of an error correction device. The iterative description of the circuit elements identical to those of the data transmission device shown in FIGS. 20A to 20D will be omitted. Moreover, the error correction and data production unit 10 uses one of, for example, 21 channels as an error correction channel, and calculates the exclusive OR (XOR) or modulo sum of transmission data items to which the remaining twenty channels are assigned. The error correction and data production unit 10 then transfers the calculated exclusive OR or modulo sum or the reverse thereof as transmission data, to which the error correction channel is assigned, to the signal element generation unit 12. Signal elements used for multilevel modulation are assigned to the data items of the transmission data.

A received signal is transferred to the signal quality detection unit 32 together with the results of identification performed by the signal identification unit 29. The signal qualities concerning the channels are then detected. The error correction unit 31 calculates the exclusive OR (XOR) or modulo sum of data items identified by the signal identification unit 29 and sent on the channels. The signal quality detection unit 32 converts errors, that is, differences between the signal elements of the received signal and the results of identification into scalars. A difference of the result of integration of the scalars from a reference value predefined in relation to an error ratio is calculated. Consequently, a binary quality evaluation signal is produced. (For details, refer to, for example, Japanese Examined Patent Application Publication No. 58-54686.) According to the present embodiment of the present invention, the binary signal is not produced but the result of integration or the difference from the reference value is adopted as a signal quality value as it is.

The exclusive OR or modulo sum of data items identified by the error correction unit 31 or the exclusive OR or modulo sum of data items sent on the channels other than the error correction channel from the transmitting side is calculated and adopted as transmission data sent on the error correction channel. Otherwise, the transmitting side reverses the calculated exclusive OR or modulo sum, and adopts the resultant data as transmission data sent over the error correction channel. In this case, if no error occurs, the transmission data is 1 that is a predetermined specific value. The identified data items sent on the 20 channels are transferred to the code converter 30 as they are. If the exclusive OR is not the specific value but 0, it means that an error has occurred in data sent on any channel. The data sent on the channel whose signal quality is detected to be the worst by the signal quality detection unit 32 is replaced with the exclusive OR or modulo sum of data items sent on the channels other the channel. Consequently, the data containing an error is corrected.

FIG. 2 is an explanatory diagram concerning the error correction and data production unit employed in the present embodiment of the present invention. An exclusive OR unit 35 calculates the exclusive OR of data items to which the channels are sequentially assigned. Alternatively, the exclusive OR unit 35 may be realized with logical gates that calculate the exclusive OR of data items in parallel with one another or with software that calculates the exclusive OR. The exclusive OR is equivalent to the modulo sum of data items to which the channels are assigned. The exclusive OR unit employed in the present invention includes a module adder. The exclusive OR unit 35 calculates the exclusive OR of data items assigned channels from channel 0 to channel 19, and adopts the calculated exclusive OR as transmission data assigned the error correction channel. The exclusive OR of the transmission data assigned the error correction channel and the transmission data items assigned channels 0 to 19 is 0.

For example, assuming that channels 0 and 1 are used as channels assigned to data items and channel 2 is used for error correction, the exclusive OR operation will be described briefly. The exclusive OR operation is an operation whose result is 1 if two bits are different from each other and whose result is 0 if two bits are identical to each other. The exclusive OR operation is therefore identical to module addition. Assuming that data assigned channel 0 is 01 and data assigned channel 1 is 11, the exclusive OR of the data items is 10. The data of 10 is adopted as data assigned the error correction channel. The exclusive OR of data items assigned channels 0 and 1, and the error correction channel that is channel 2; that is, the exclusive OR (or modulo sum) of 01, 11, and 10 is 00. The data assigned the error correction channel and calculated by the exclusive OR unit 35, and the data items assigned channels 0 to 19 are transferred to the signal element generation unit 12, adopted as modulating signal elements, and transferred to the inverse FFT unit 13 shown in FIG. 1.

FIG. 3 is an explanatory diagram concerning the error correction unit employed in the embodiment of the present invention. Data items sent on channels 0 to 19 and identified by the signal identification unit (DEC) 19 are transferred to the identifying and processing unit 39 and exclusive OR unit (XOR) 37 respectively. Identified data sent on the error correction channel is transferred to the exclusive OR unit 37. The exclusive OR unit 37 has the same circuitry as the aforesaid exclusive OR unit 35. The signal identification unit 29 transfers the vectors of the differences between the signal elements of a received signal sent on channels 0 to 19 and the error correction channel and the identified data items to the signal quality detection unit (SQD) 38. The signal identification unit 29 also transfers error signals, each of which includes a phase error component and an amplitude error component of each signal element, to the signal quality detection unit (SQD) 38. Specifically, the exclusive OR unit 37 calculates the exclusive OR of the identified data items sent on channels 0 to 19 and the identified data sent on the error correction channel, and transfers the calculated exclusive OR to the identifying and processing unit 39. The signal quality detection unit 38 having the same capability as the signal quality detection unit 32 shown in FIG. 1 detects the signal qualities concerning the channels, and transfers them to the identifying and processing unit 39.

Assume that the transmitting side adopts the exclusive OR of data items assigned channels 0 to 19 as the transmission data assigned the error correction channel. In this case, if the exclusive OR of the identified data items sent on the channels which is calculated by the exclusive OR unit 37 is not 0 (XOR is not equal to 0), the identifying and processing unit 39 replaces the data, which is sent on the channel whose signal quality is detected to be the worst by the signal quality detection unit 38 as a result of detecting the signal qualities concerning the channels, with the exclusive OR of the identified data items sent on the channels other than the channel. The resultant signal is regarded as received data. If the exclusive OR is 0 (XOR=0), the identified data sent on the channels are provided as they are, that is, the identified data items sent on channels 0 to 19 are adopted as received data items as they are.

For example, assuming that the exclusive OR is not 0, if the channel whose signal quality is detected to be the worst is channel 2, the identifying and processing unit 39 replaces the exclusive OR of the data items sent on channels 0 and 1, and channels 3 to 19 and error correction channel other than channel 2 with the data sent on channel 2 and adopts the resultant data as received data. The employment of the error correction channel makes it possible to correct data sent on one of a plurality of channels.

According to the foregoing embodiment, one of a plurality of data channels is used as an error correction channel. Namely, an error contained in data sent on any one of a plurality of data channels is corrected. A plurality of channels out of a plurality of data channels may be used as error correction channels. The relationships between the data channels and error correction channels may be discussed using a regular polyhedron. Thus, errors occurring on a plurality of data channels may be corrected. Moreover, data assigned each channel may be not only realized with a single bit but also composed of a plurality of bits. For example, data items assigned channels 0 to 19 may each be composed of two bits. If the modulo sum of the data items is 01, transmission data assigned an error correction channel is set to 11 so that the modulo sum of 01 and 11 will be 00. The transmission data assigned the error correction channel may be fixed to a predetermined specific value according to the calculated exclusive OR or modulo sum.

The regular polyhedron may be, as shown in FIGS. 4A to 4E, a regular tetrahedron, a regular hexahedron, a regular octahedron, a regular dodecahedron, or a regular icosahedron. For example, the regular dodecahedron has twelve regular pentagonal surfaces and thirty sides. When channels are associated with the sides, thirty channels are associated with the sides of the twelve surfaces. In this case, one of five channels associated with each surface is used as an error channel. Likewise, in the case of the regular tetrahedron, four out of all the six channels are used as error correction channels. In the case of the regular hexahedron, six out of all the twelve channels are used as error correction channels. In the case of the regular octahedron, eight out of all the twelve channels are used as error correction channels. In the case of the regular dodecahedron, twelve out of all the thirty channels are used as error correction channels. In the case of the regular icosahedron, twenty out of all the thirty channels are used as error correction channels.

Figure 5:
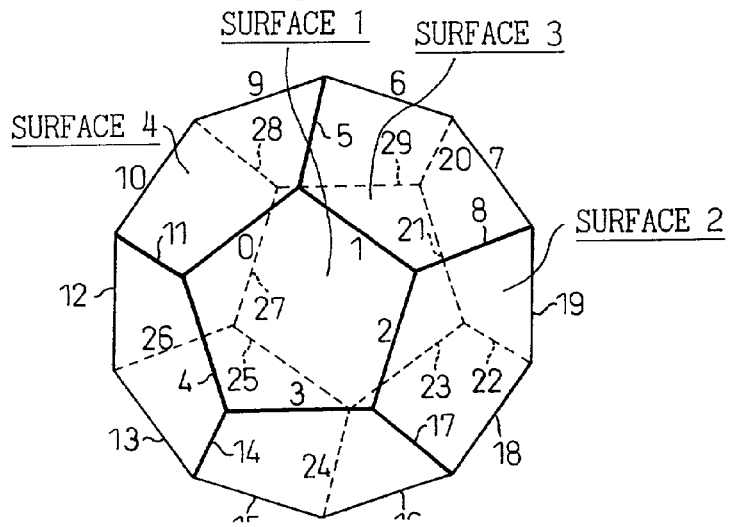
FIG. 5 is an explanatory diagram concerning the relationship between a regular dodecahedron and channels.

FIG. 5 is an explanatory diagram concerning the relationship between a regular dodecahedron and channels. Side numbers 0 to 29 are assigned to the sides of the regular dodecahedron. Surface 1 has five sides of side numbers 0 to 4. Channels 0 to 4 are associated with the sides. The exclusive OR of transmission data items assigned the five channels is calculated. One of the channels associated with the sides is used as an error correction channel, and the calculated exclusive OR is adopted as transmission data assigned the error correction channel. Thus, an error occurring in data to which one of the channels associated with surface 1 is assigned can be corrected.

Figure 6:
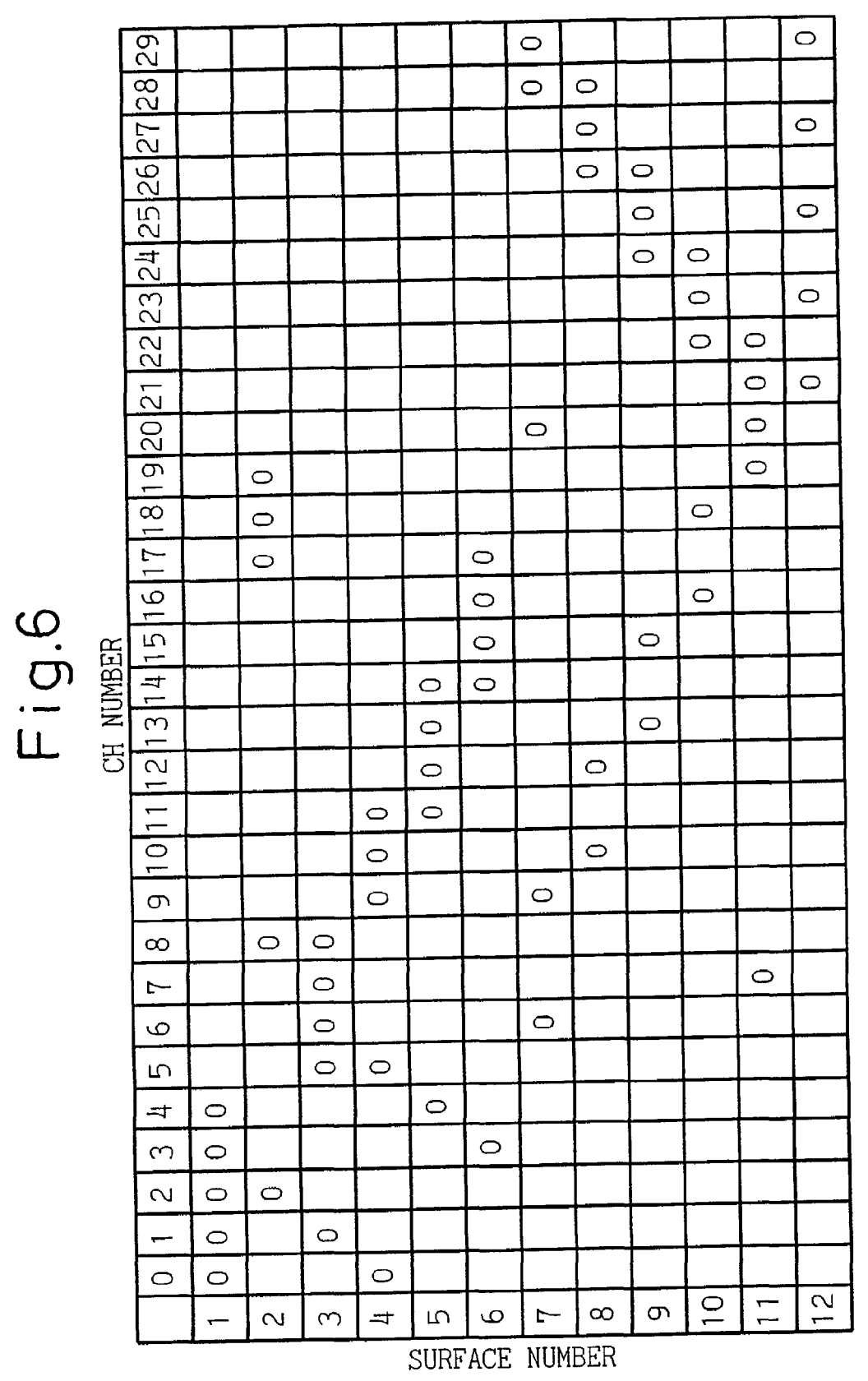

Likewise, channels are associated with the sides of each surface other than surface 1, and the exclusive OR of transmission data items assigned the five channels is calculated. One of the channels is used as an error correction channel, and the calculated exclusive OR is adopted as transmission data assigned the error correction channel. Any of channel numbers 0 to 29 grouped and associated with any of surface numbers 1 to 12 are indicated with round marks in FIG. 6. When one of the channels associated with a surface is used as an error correction channel, twelve error correction channels are available in total.

For example, assuming that the arrangements shown in FIG. 2 and FIG. 3 and employed in the embodiment are designed to manipulate five channels, when twelve pairs of the arrangements are included, thirty channels can be associated with the sides of a regular dodecahedron and errors occurring in data items assigned twelve channels out of the thirty channels can be corrected. In other words, the embodiment shown in FIG. 2 and FIG. 3 may be discussed in such a manner that: channels are associated with the sides of a regular twenty-one-sided polygon on a two-dimensional plane; one of the channels is used as an error correction channel; and the other channels associated with the other twenty sides are used as data channels (channels 0 to 19). Consequently, when channels are associated with the sides of each surface of a regular polyhedron, an error correction device includes the error correction unit shown in FIG. 3 and designed to manipulate channels associated with the sides of each surface thereof.

When the relationships of the sides of the surfaces of a regular dodecahedron to the surfaces thereof is adopted, twelve out of thirty channels are used as error correction channels. An error contained in identified data sent on one channel whose signal quality is the worst among the channels associated with the same surface can be corrected. Consequently, errors occurring on twelve channels, that is, the same number of channels as the number of error correction channels can be corrected.

According to the embodiment, as mentioned above, an error occurring on one channel among the channels associated with each surface can be corrected. However, errors occurring on a plurality of channels among the channels associated with each surface cannot be corrected. Therefore, twelve groups of (20–12=8) eight or more channels are defined in order to enable correction of errors occurring on any twelve channels among the twenty channels. Twelve simultaneous equations are solved. Thus, errors occurring on up to twelve channels among all the channels associated with all the surfaces can be corrected. As for grouping of channels, for example, channels associated with the sides of one surface and channels associated with the sides of surfaces adjoining the surface are grouped together.

Figure 7A:
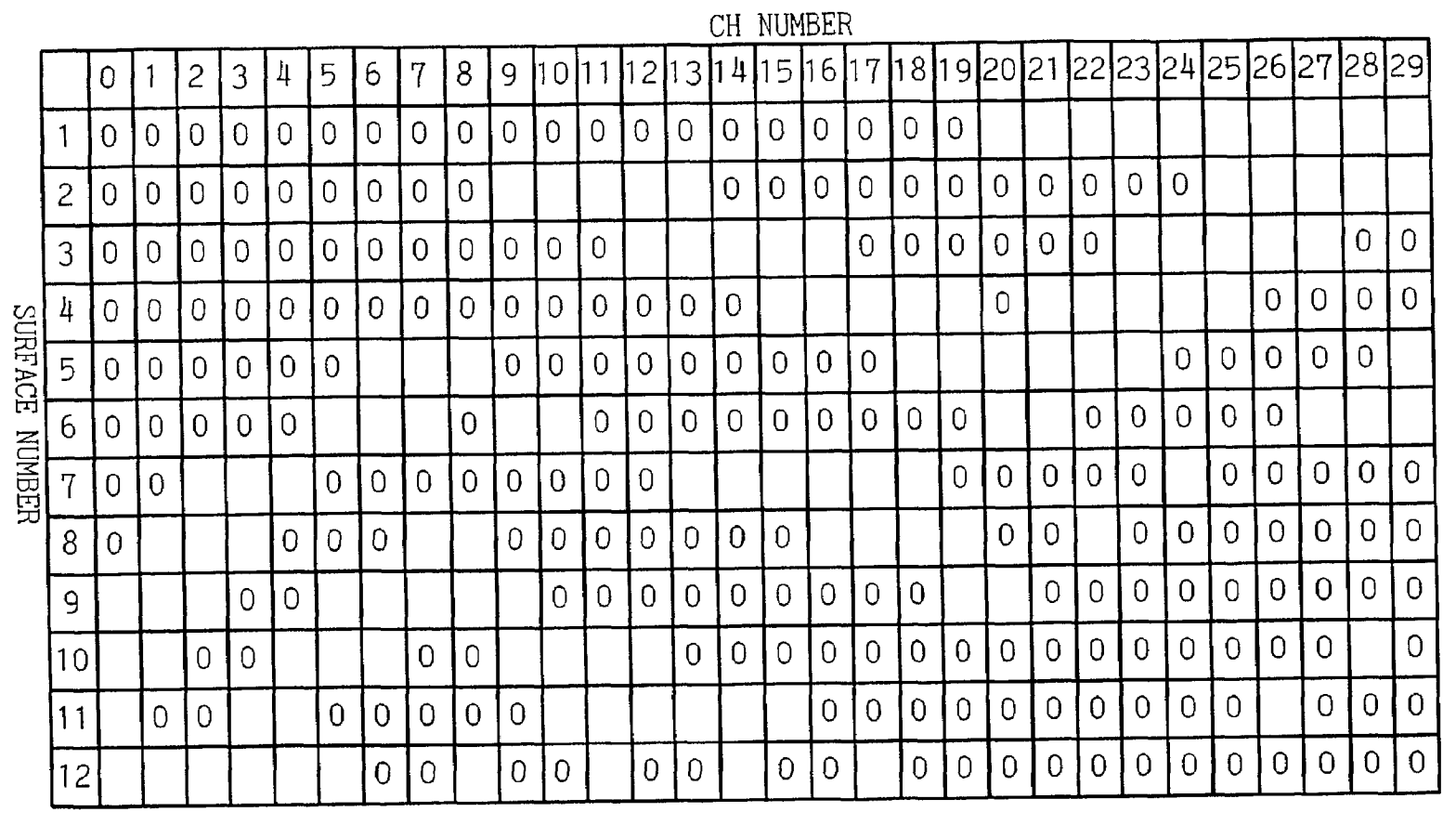
Figure 8:
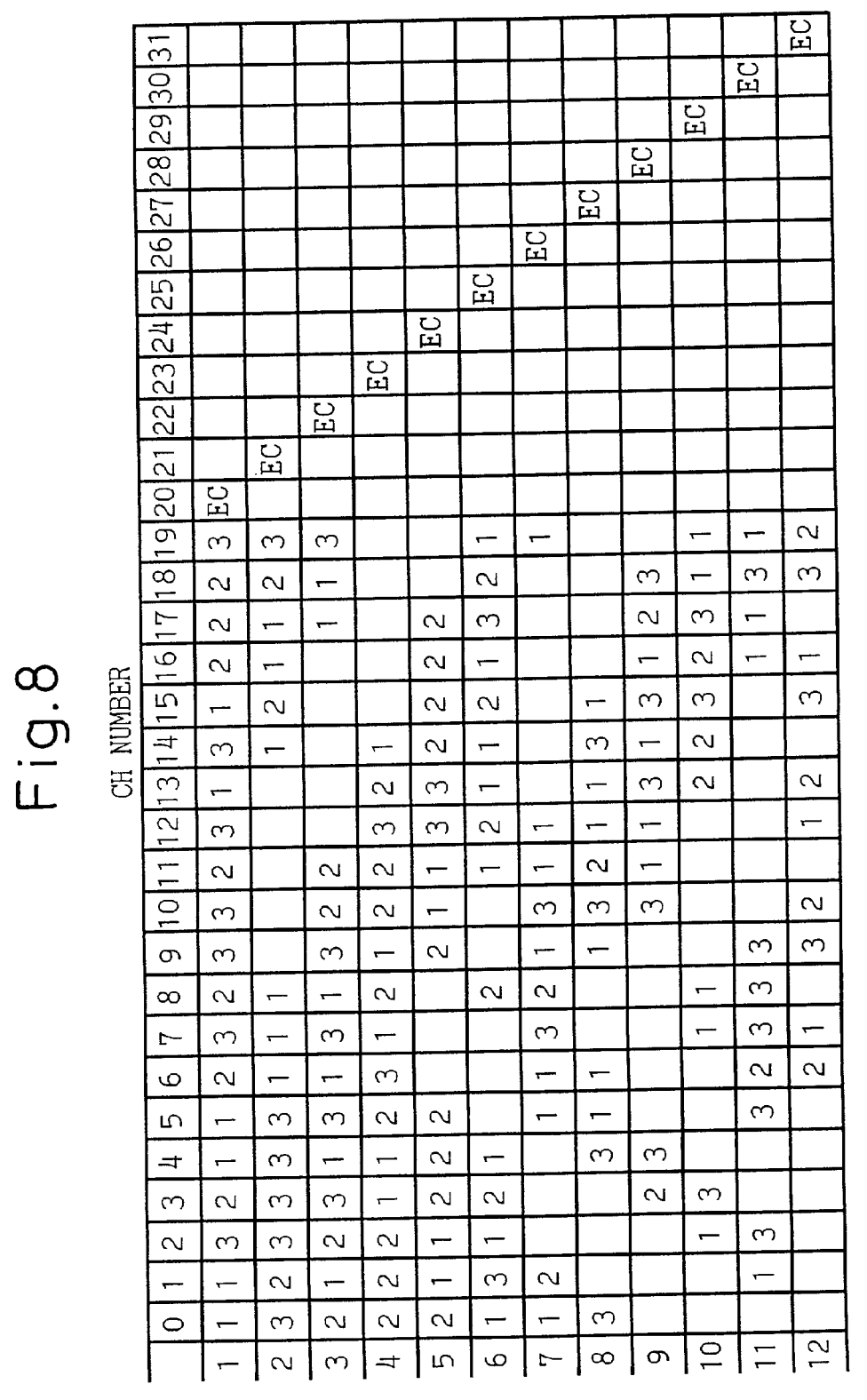

Coefficients are assigned at random to channels so that the twelve simultaneous equations will be established mutually independently. A modulo sum is calculated and transmitted on an error correction channel. As shown in FIG. 7A, channel numbers associated with surface numbers and grouped together are indicated with round marks. In this case, when error correction channels EC each defined as one of the channels associated with each surface are, as shown in FIG. 7B, channels 20 to 31, any of a total of 32 channels can be grouped together. Coefficients to be assigned to the channels assume, as shown in FIG. 8, for example, 1, 2, or 3. Channels 0 to 19 associated with surfaces 1 to 12 are used as data channels, and channels 20 to 31 are used as error correction channels EC. The modulo sum of data items assigned the data channels associated with a surface is adopted as transmission data assigned an error correction channel EC. Moreover, the coefficient values are not limited to 1, 2, and 3. A larger number of coefficient values may be adopted and assigned to channels at random in advance.

For example, assume that data items assigned channels 0 to 19 associated with surface 1 are data items D0 to D19. The data items are multiplied by the coefficients, and modulo-added, whereby data assigned the error correction channel EC1 associated with surface 1 is calculated. The data assigned the error correction channel EC1 should meet the condition expressed as follows:

$1 \times D0 + 1 \times D1 + 3 \times D3 + 1 \times$ $D4 + \ldots + 2 \times D17 + 2 \times D18 + 3 \times$ $D19 + EC1 = 0.$ Alternatively, the data assigned the error correction channel may be determined so that the modulo sum of the data and the modulo sum of the products of the data items D0 to D19 by the coefficients will be any predetermined specific value other than 0. For example, assuming that data assigned each channel is composed of two bits, if the modulo sum of the products of the data items DO to D19 by the coefficients is 01, the data assigned the error correction channel is 11. Namely, since the modulo sum of 01 and 11 is 00, 11 is determined as the data assigned the error correction channel.

The receiving side manipulates identified data items represented by signal elements sent on the channels in consideration of the grouping of channels associated with surfaces shown in FIG. 8. The data items sent on the channels are weighted with the coefficients employed at the transmitting side, and modulo-added. Twelve simultaneous equations are established. If occurrence of an error is detected, twelve channels detected as having the twelve worst detected signal qualities by the signal quality detection unit are selected. The data items assigned the twelve channels are regarded as unknowns. Since the data items sent on the other channels contain no error, the data items are regarded as known quantities (constants). The twelve simultaneous equations having the unknowns that are the data items assigned the twelve channels can be established.

The twelve simultaneous equations are solved, whereby the errors occurring on the twelve channels can be corrected. The twelve simultaneous equations can be solved using, for example, the Gauss-Jordan elimination. For example, the same coefficients as those adopted at the transmitting side are, as shown in FIG. 8, assigned to the channels that are associated with surfaces and grouped together. Assume that a total of 12 channels, that is, channels 0 to 2, channels 8 to 10, channels 16 to 18, and channels 24 to 26 which are associated with surfaces 1 to 12 are selected as channels whose signal qualities are detected to be the worst to the twelfth worst during error detection. As mentioned above, data items sent on the channels on which no error has occurred are regarded as known quantities (constants). For example, data items sent on the channels associated with surface 1 are multiplied by the aforesaid coefficients, and modulo-added. The calculated modulo sum is adopted as the data item A sent on the error correction channel. The modulo sum of the calculated modulo sum and the data item A should be 0. This is expressed as an equation of $1 \times D0 + 1 \times D1 + 3 \times D2 + 2 \times$ $D8 + 3 \times D9 + 3 \times D10 + 2 \times D16 +$ $2 \times D17 + 2 \times D18 + A = 0.$ FIG. 10A shows coefficient values by which data items sent on channels on which an error has occurred are multiplied.

Twelve equations like the above one each of which includes a multiplication of identified data items sent on channels associated with each of surfaces 1 to 12 by the coefficients are created. Referring to FIGS. 10A to 10B to FIG. 16, a procedure of solving the twelve equations will be described below. FIG. 10B is concerned with the first step of the procedure. At the first step, coefficients assigned to channels 0 other than channel 0 associated with surface 1 are reset to 0. The coefficients assigned to the error channels associated with surface 1 assume the values of 1, 1, 3, 2, 3, 3, 2, 2, and 2 respectively. Moreover, the coefficients assigned to channels 0 associated with all the surfaces have assumed the values of 1, 3, 2, 2, 2, 1, 1, and 3 respectively. As the coefficients assigned to channels 0 other than channel 0 associated with surface 1 are set to 0, the coefficient assigned to each of channels 1 to 18 associated surface 1 is multiplied by the coefficient originally assigned to each of channels 0 associated with surfaces 2 to 12. The product is then subtracted from the coefficient originally assigned to each channel associated with each of surfaces 2 to 12. The resultant coefficient values are manipulated at subsequent steps.

For example, the coefficient assigned to channel 0 associated with surface 2 assumes a value of 3. Therefore, the coefficients assigned to channel 1 and the other channels associated with surface 1, that is, 1, 3, 2, 3, 3, 2, 2, and 2 are multiplied by the coefficient 3. The products are then subtracted from the coefficients assigned to the channels associated with surface 2. Therefore, the coefficients assigned to the channels associated with surface 2 now assume the values of 0, −1, −6, −5, −9, −9, −5, −5, −4, 0, 0, and 0 respectively. Specifically, the coefficient assigned to channel 2 associated with surface 2 originally assumes a value 3, and the coefficient assigned to channel 2 associated with surface 1 assumes 3. Therefore, 3−3×3=−6. As for channel 24 to channel 26, the coefficients assigned to the channels associated with surface 1 assume a value of 0. Therefore, 0−3×0=0. Likewise, since the coefficient originally assigned to channel 0 associated with surface 3 is 2, the coefficients originally assigned to the channels associated with surface 3, that is, 2, 1, 2, 1, 3, 2, 0, 1, 1, 0, 0, and 0 respectively as shown in FIG. 10A are reset to 0, −1, −4, −3, −4 −4, −3, −3, 0, 0, and 0 respectively as shown in FIG. 10B. Moreover, the coefficient originally assigned to the channels associated with surface 4 are reset to 0, 0, −4, −2, −5, −4, −4, −4, −4, 0, 0, and 0 respectively. Likewise, the coefficients assigned to the channels associated with surfaces 5 to 13 are manipulated. FIG. 10B shows the results of the first step.

FIGS. 11A to 11B are explanatory diagrams concerning the second step and the third step. At the second step, the coefficients assigned to channels 1 other than the channel 1 associated with surface 11 are reset to 0. Consequently, the coefficients originally assigned to the channels associated with surface 1 are reset to 1, 0, 0, −1, 0, 0, 3, 1, 1, −1, 0, 0, and 0 respectively. The coefficients originally assigned to the channels associated with surface 2 are reset to 0, 0, −3, −2, −6, −9, −4, −4, −1, 0, 0, and 0 respectively. At the third step, the coefficients assigned to channels 2 other than channel 2 associated with surface 10 are reset to 0. Consequently, the coefficients originally assigned to the channels associated with surface 1 are reset to 1, 0, 0, −1, 0, 3, 1, 1, −1, 0, 0, and 0 respectively. The coefficients originally assigned to the channels associated with surface 2 are reset to 0, 0, 0, 1, −6, −9, 2, 5, 2, 0, 0, and 0 respectively.

FIGS. 12A to 12B are explanatory diagrams concerning the fourth step and the fifth step. At the fourth step, the coefficients assigned to channels 8 other than channel 8 associated with surface 2 are reset to 0. Consequently, the coefficients originally assigned to the channels associated with surface 1 are reset to 1, 0, 0, 0, −6, −6, 3, 6, 1, 0, 0, and 0 respectively. The coefficients originally assigned to the channels associated with surface 2 are reset to 0, 0, 0, 1, −6, −9, 2, 5, 2, 0, 0, and 0 respectively. Herein, 1 succeeding four 0s is the coefficient newly assigned to channel 8 associated with surface 2. The coefficients assigned to the channels associated with the other surfaces are manipulated similarly.

At the fifth step, the coefficients assigned to channels 9 other than channel 9 associated with surface 12 are reset to 0. Consequently, the coefficients originally assigned to the channels associated with surface 1 are reset to 1, 0, 0, 0, 0, −2, 5, 6. 7, 0, 0, and 0 respectively. The coefficients originally assigned to the channels associated with surface 2 are reset to 0, 0, 0, 1, 0, −5, 4, 5, 8, 0, 0, and 0 respectively.

FIGS. 13A to 13B are explanatory diagrams concerning the sixth step and the seventh step. At the sixth step, the coefficient assigned to channels 10 other than channel 10 associated with surface 3 are reset to 0. At the seventh step, the coefficients assigned to channels 16 other than channel 16 associated with surface 5 are reset to 0. Consequently, for example, the coefficients originally assigned to the channels associated with surface 1 are reset to 8, 0, 0, 0, 0, 0, 0, 24, −76, 15, 0, and 0 respectively. The coefficients originally assigned to the channels associated with surface 2 are reset to 0, 0, 0, 1, 0, −5, 4, 5, 8, 0, 0, and 0 respectively.

FIGS. 14A to 14B are explanatory diagrams concerning the eighth step and the ninth step. At the eight step, the coefficients assigned to channels 17 other than channel 17 associated with surface 9 are reset to 0s. Consequently, the coefficient assigned to channel 17 associated with surface 9 is reset to −2. At the ninth step, the coefficients assigned to channels 18 other than channel 18 associated with surface 6 are reset to 0. Consequently, the coefficient assigned to channel 18 associated with surface 6 is reset to −44.

FIGS. 15A to 15B are explanatory diagrams concerning the tenth step and the eleventh step. At the tenth step, the coefficients assigned to channels 24 other than channel 24 associated with surface 4 are reset to 0. Consequently, the coefficient assigned to channel 24 associated with surface 4 is reset to 5496. At the eleventh step, the coefficients assigned to channels 25 other than channel 25 associated with surface 8 are reset to 0. Consequently, the coefficient original assigned to channel 25 associated with surface 8 is reset to 5038872. For example, the coefficient assigned to channel 0 associated with surface 1 now assumes 9.7004E+14 that means $9.7004 \times 10^{14}$. Actually, the coefficient assumes a value of 97004028454502.

FIG. 16 is an explanatory diagram concerning the twelfth step. The coefficients resulting from the eleventh step and assuming any values other than 0 as shown in FIGS. 15A to 15B are reset to 1. For example, the coefficient assigned to channel 0 associated with surface 1 assumes the value of 1. Therefore, the data sent on channel 0 is recognized as error data and corrected. Likewise, the coefficient assigned to channel 8 associated with surface 2 assumes 1, and the coefficient assigned to channel 10 associated with surface 3 assumes 1. Consequently, errors contained in the data items sent on the twelve channels whose signal qualities have deteriorated are corrected. Incidentally, the twelve channels are listed in FIG. 10A. Assume that the solutions of twelve simultaneous equations are expressed as, for example, $1 \times D0 + \beta = 0$, that data is composed of two bits, and that $\beta$ is set to modulo 4. In this case, when $\beta$ equals 00, data D0 sent on channel 0 is 00. When $\beta$ equals 01, D0 is 11. When $\beta$ equals 10, D0 is 10. When $\beta$ equals 11, D0 is 01. Thus, an error is corrected.

At the first to twelfth steps, the results of multiplication and addition of coefficients are listed as they are. If modulo addition is performed at each step, the coefficients can be limited to small values. For example, if the maximum value for the coefficients is set to 3, error-corrected data can be set to modulo 3. A means for solving the simultaneous equations can be easily realized with dedicated hardware or an arithmetic facility such as a digital signal processor (DSP).

According to the foregoing embodiment, channels associated with the sides of the surfaces of a regular polyhedron are divided into groups in order to correct errors occurring on a plurality of data channels simultaneously. Alternatively, channels associated with the sides of the surfaces of a regular multi-vesicular body that is a graphic in a four-dimensional space equivalent to the regular polyhedron may be divided into groups. For example, a regular eight-vesicular body has regular hexahedrons as components, and has sixteen vertexes, thirty-two sides, and twenty-four surfaces. A regular 24-vesicular body has regular octahedrons as components, and has 24 vertexes, 96 sides, and 96 surfaces. Similarly to the polyhedrons, channels associated with the sides of the surfaces of a regular multi-vesicular body are divided into groups. Thus, errors may be corrected.

In a system to which the quadrature amplitude modulation (QAM) or any other multilevel modulation technique is adapted, for example, 256-level QAM may be implemented using an 8-bit signal. In this case, the channels are assigned to the eight respective bits, the exclusive OR of the bits is adopted as a bit assigned an error correction channel. In this case, data is composed of seven bits. One bit is adopted as an error correcting bit (assigned the error correction channel). According to the multilevel modulation technique, if the distance between signal elements is so large, an identification error will not occur. Therefore, all bits are not manipulated but part of all bits is manipulated as a subset. Error correction is performed on the subset. The remaining bits are identified by excluding signal elements that represent the subset. This is equivalent to a case where the distance between signal elements is extended. Therefore, the occurrence of the identification error can be minimized.

Figure 17B:
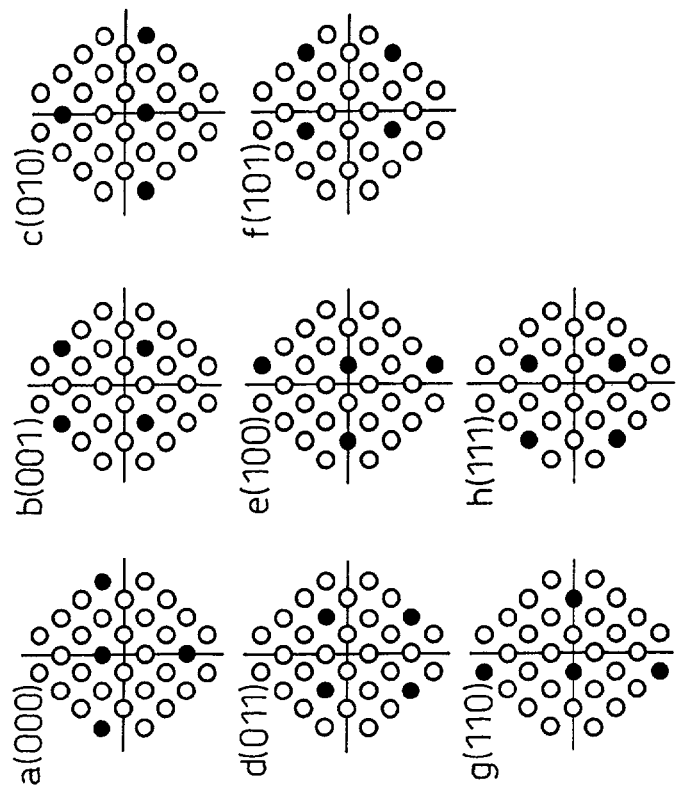
FIGS. 17A to 17B are explanatory diagrams concerning signal elements.
Figure 17A:
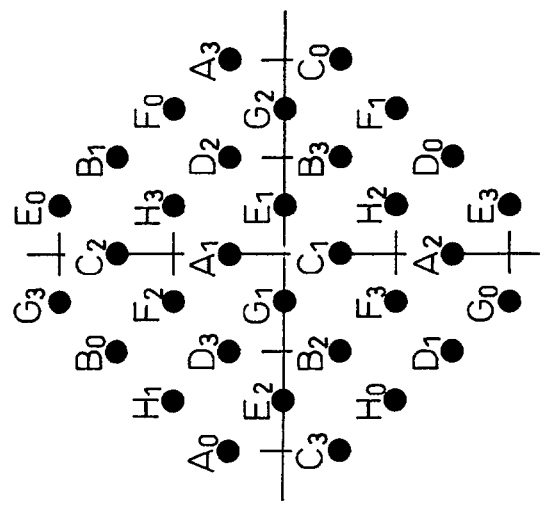

FIG. 17A and FIG. 17B are explanatory diagrams concerning signal elements. FIG. 17A shows an example of locations of signal elements that represent five bits. Thus, the signal elements or modulating signal elements express 32 levels. Three bits out of five bits are manipulated as a subset.

Depending on what combination of values such as "000" or "111" the bits assume, the signal elements are located at points shown in any of a to h in FIG. 17B. Two bits of each subset are represented by signal elements indicated with black dots. Therefore, three out of five bits are manipulated as a subset. The aforesaid error correction is performed on the subset. An error in identifying the remaining two bits is minimized because the distance between signal elements representing the remaining two bits extends. In other words, part of a plurality of bits is manipulated as a subset. The exclusive OR of the bits belonging to the subset is calculated and adopted as an error correction bit. An error is corrected based on the error correction bit. The remaining bits are identified as they usually are. In this case, since the distance between signal elements representing the remaining bits is extended, an error in identifying the remaining bits is minimized.

FIG. 18 is an explanatory diagram concerning error correction performed on a subset according to an embodiment of the present invention. Bit numbers and channel numbers are listed in FIG. 18. Each of thirty-two channels of channels 0 to 31 is assigned to a signal composed of eight bits of bit number 0 to bit number 7. On each channel, a signal is transmitted according to the 256-level QAM. Moreover, the channels are grouped in fours. One of four channels belonging to one group is used as an error correction channel. The exclusive OR of subsets of bits assigned the channels other than the error correction channel is calculated and adopted as a subset of bits assigned the error correction channel.

For example, two bits of bit 0 and bit 1 are manipulated as a subset. The exclusive OR of bits 0 assigned channels 0 to 2 is adopted as an error correcting bit that serves as bit 0 assigned channel 3 which is an error correction channel. The exclusive OR of bits 1 assigned channels 0 to 2 is adopted as an error correction bit of bit 1 assigned channel 3. Incidentally, D in FIG. 18 denotes a data bit, EC denotes an error correcting bit. Since the error correcting bits are thus produced, data assigned channel 3, 7, 11, 15, 19, 23, 27, or 31 is composed of 6 bits.

Moreover, the exclusive OR of bits 0 assigned to channels 4 to 6 is adopted as an error correcting bit that serves as bit 0 assigned to channel 7. The exclusive OR of bits 1 assigned channels 4 to 6 is adopted as an error correcting bit that serves as bit 1 assigned channel 7. Likewise, error correcting bits are produced for subsets. As far as error correction of a subset of two bits is concerned, the error correcting means employed in the embodiment described in conjunction with FIG. 2 and FIG. 3 is useable. As for the remaining six bits other than the subset of two bits, the signal elements other than the signal elements representing the two bits of the subset are identified. This is equivalent to a case where the distance between the signal elements is extended. Consequently, an error in identifying the signal elements is minimized.

Figure 19:
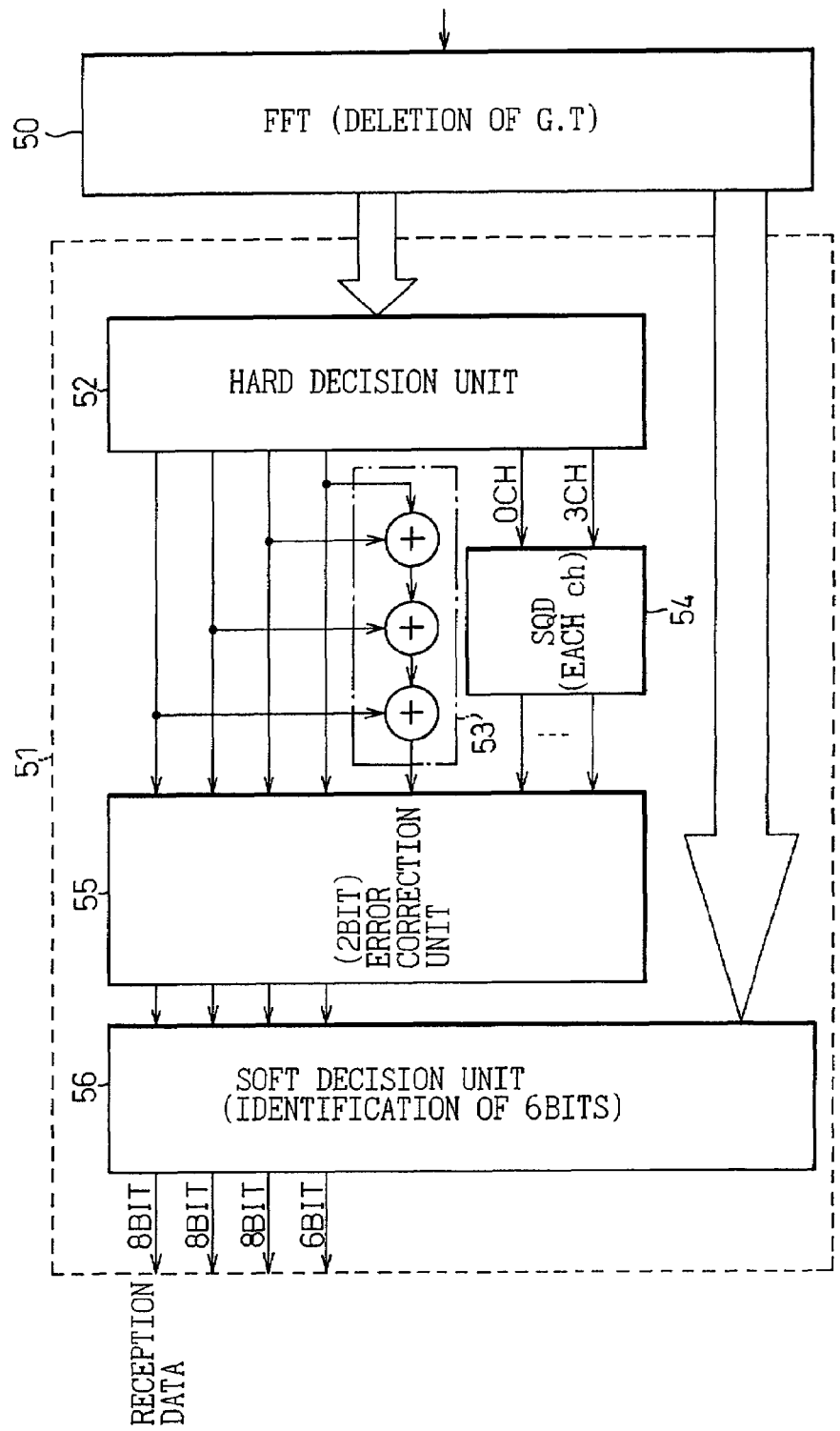
FIG. 19 is an explanatory diagram concerning error correction performed on subsets according to the embodiment of the present invention.
Figure 20A:
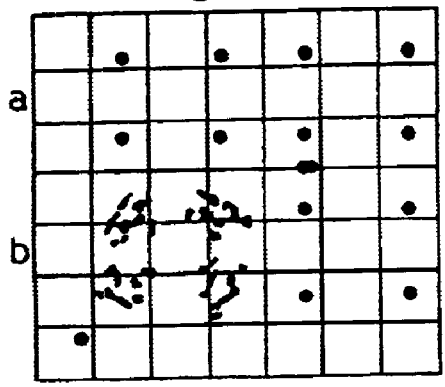
FIGS. 20A to 20D are explanatory diagrams showing eye pattern views and spectra.
Figure 20C:
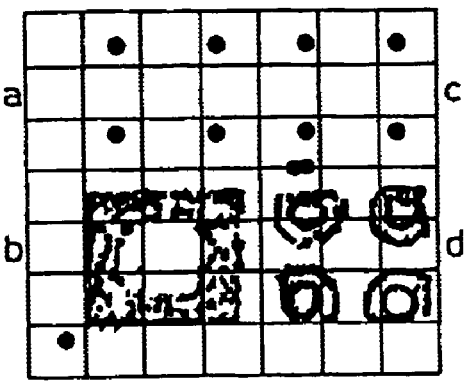
Figure 20B:
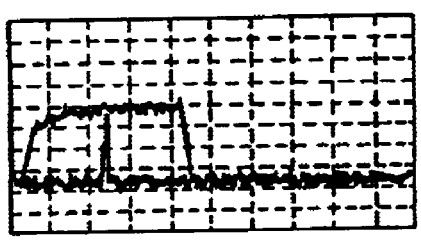
Figure 20D:
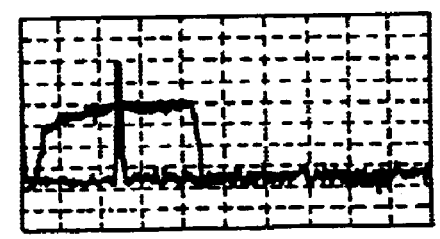
Figure 21E:
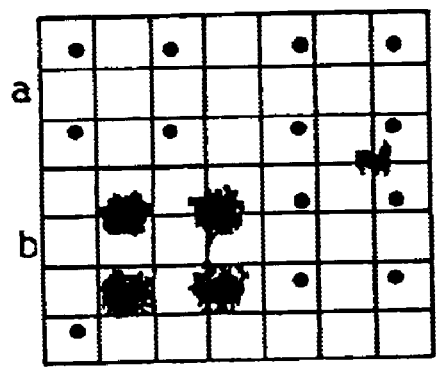
FIGS. 21E to 21H are explanatory diagrams showing eye pattern views and spectra.
Figure 21G:
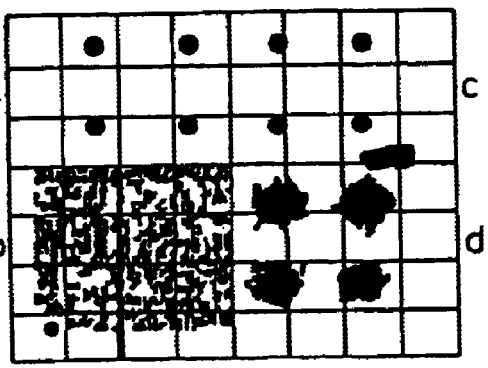
Figure 21F:
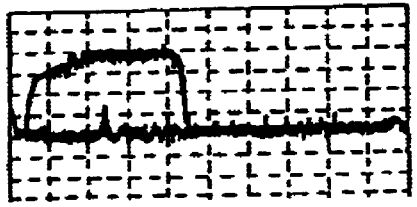
Figure 21H:
Figure 23A:
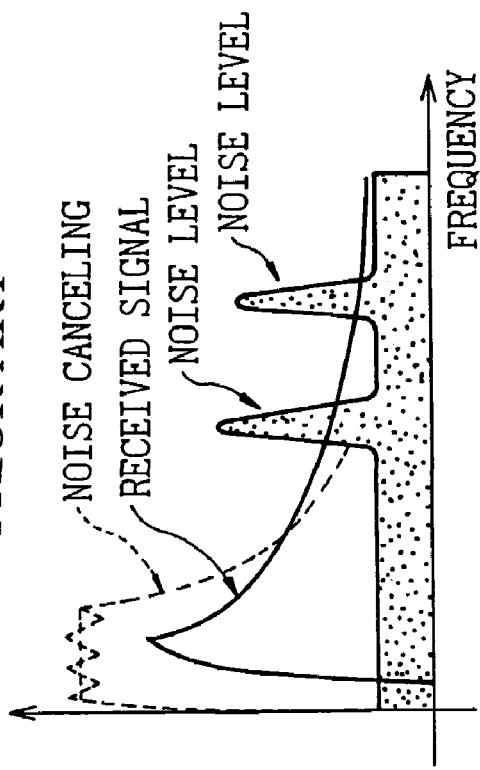
FIGS. 23A to 23B are explanatory diagrams concerning noise canceling.
Figure 23B:
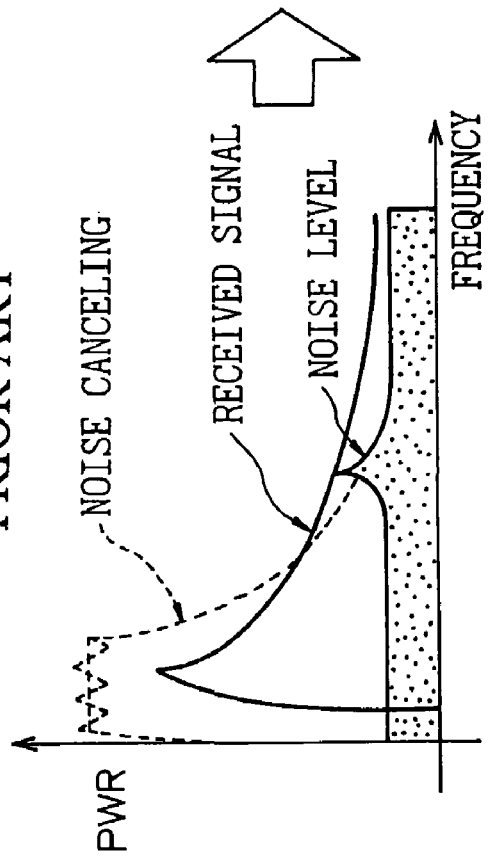

FIG. 19 is an explanatory diagram concerning error correction performed on a subset according to an embodiment of the present invention. A fast Fourier transform (FFT) unit 50 has a guard time GT deletion capability and corresponds to the fast Fourier transform unit 28 shown in FIG. 1. There are shown an error correction/identification and processing unit 51, a hard decision unit 52, an exclusive OR unit 53, a signal quality detection unit (SQD) 54, an error correction unit 55, and a soft decision unit 56. The error correction/identification and processing unit 51 has the capabilities of the signal identification unit 29, error correction unit 31, and signal quality detection unit 32 shown in FIG. 1. As shown in FIG. 18, each channel is assigned to a signal composed of eight bits. Two bits out of the eight bits are manipulated as a subset. The arrangement shown in FIG. 19 manipulates subsets assigned channels 0 to 3.

The error correction/identification and processing unit 51 transfers an output of the FFT unit 50 into the hard decision unit 52 and soft decision unit 56 respectively. The results of hard determination performed by the hard decision unit 52, that is, two identified bits of bit 0 and bit 1 are transferred to the error correction unit 55 and exclusive OR unit 53 respectively. As shown in FIG. 18, the exclusive OR of data items sent on channels 0 to 2 is adopted as transmission data sent on channel 3. If the exclusive OR of the results of hard determination which is calculated by the exclusive OR unit 53 is 0, subsets sent on channels 0 to 2 are judged to contain no error. If the exclusive OR is not 0, the subsets are judged to contain an error.

The signal quality detection unit 54 detects the signal qualities concerning channels 0 to 3 according to an error signal provided as a result of hard identification. If an output of the exclusive OR unit 53 is not 0, the error correction unit 55 identifies a channel whose signal quality is detected to be the worst by the signal quality detection unit 54. The exclusive OR of bits sent on the channels other than the channel is adopted as a bit sent on the channel. The bit is used to perform error correction.

The soft decision unit 56 performs soft identification on six bits sent from the FFT unit 50. In this case, when the locations of signal elements other than the signal elements representing two bits are discussed, the distance between the signal elements is extended. This means that an error in identifying the signal elements is minimized. Data items sent on channels 0 to 2 are provided as 8-bit received data items, and data sent on channel 3 and containing error correction bits is provided as 6-bit received data. The other channels are also grouped in fours, or in other words, divided into groups of channels 4 to 7, channels 8 to 11, channels 12 to 15, channels 16 to 19, channels 20 to 23, channels 24 to 27, and channels 28 to 31. The aforesaid error correction is performed group by group. This obviates the necessity of performing error correction on all bits and minimizes an error in identifying data.

FIGS. 20A to 20D show the presentations of eye pattern views (20A) and (20C) and spectra (20B) and (20D) of a signal transmitted at a transmission speed of 2 (bits)×20 (channels)×4.8 (k baud rate)=192 (kbps) according to 4 levels QAM within a power line carrier communication system. A tone burst of noises is superposed on the signal as observed in the spectra (20B) and (20D). The channels a, b, c, and d around the tone burst are shown in the eye pattern views (20A) and (20C). In the eye pattern views (20A) and (20C), the channels a, b, c, and d are each assigned to four signal elements impressed on a signal component.

Referring to FIGS. 20A to 20D, (20A) and (20B) are concerned with a case where error correction is not performed. When the single tone burst observed in (20B) is superposed on the signal, channel b near the single tone burst is affected most adversely as seen from (20A). The signal elements spread. This results in an error in identification. A limit of a range of signal-to-noise ratios within which occurrence of an error is not detected is +2 dB.

Moreover, a single tone burst of noises higher than the single tone burst of noises observed in (20B) is superposed on a signal as observed in (20D). The eye pattern view (20C) demonstrates the fact that channel b near the single tone burst is affected most adversely. The signal elements spread more widely. Moreover, the signal elements sent over channel d also spread. Error correction is therefore performed. Occurrence of an error is not detected by this stage visualized as (20D) and (20C). The error correcting means employed in the present invention and described in conjunction with FIG. 2 and FIG. 3 can be adapted to this case. A limit of a range of signal-to-noise ratios within which occurrence of an error is not detected is −22 dB. Namely, when error correction is performed according to the embodiment of the present invention, the efficiency in error correction improves to an extent equivalent to a signal-to-noise ratio of 24 dB.

FIGS. 21E to 21H show eye pattern views (21E) and (21G) and spectra (21F) and (21H) of signals transmitted at a transmission speed of 8 (bits)×30 (channels)×4.8 (k baud rate)=1,152 (kbps) according to the 256-level QAM within a power line carrier communication system. The eye pattern views (21E) and (21G) show channels a, b, c, and d near a single tone burst similarly to the eye pattern views (20A) and (20C) shown in FIGS. 20A to 20D, wherein signal elements are grouped together and measured in order to express four levels instead of 256 levels. As observed in the spectrum (21F), even when the noise level of a single tone burst is low, signal elements sent on channel b spread over frequencies. Without error correction, the limit of a range of signal-to-noise ratios within which occurrence of an error is not detected is about +26 dB.

Moreover, the spectrum (21H) shows a single tone burst whose noise level is higher than the noise level of the single tone burst shown in the spectrum (21F). The eye pattern view (21E) demonstrates that signal elements sent on channel b are almost completely dispersed. Signal elements sent on channel d spread widely over frequencies. Namely, owing to the error correction in accordance with the embodiment of the present invention described in conjunction with FIG. 2 and FIG. 3, the limit of a range of signal-to-noise ratios within which occurrence of an error is not detected has come to about +10 dB. Thus, the efficiency in error correction has improved to an extent equivalent to a signal-to-noise ratio of 16 dB.

The present invention is not limited to the aforesaid embodiments but can be implemented in various communication techniques including radiocommunication. Moreover, the present invention can be implemented in identification of data reproduced from a recording medium that is equivalent to a data transmission line and that suffers from deformation in the waveform of a signal deriving from superposition of noises on the signal. Moreover, the exclusive OR or modulo sum of data items sent on channels other than an error correction channel is adopted as data sent on the error correction channel. Alternatively, a parity bit may be used.

As described so far, according to the present invention, at least one of a plurality of channels is used as an error correction channel. The exclusive OR or modulo sum of data items sent on the other channels is adopted as data sent on the error correction channel. Data items sent on a plurality of channels are identified, or data items reproduced over a plurality of channels are identified. It is checked if the exclusive OR or modulo sum of identified data sent on an error correction channel and identified data items, which are sent on channels belonging to the same group as the error correction channel does, is a predetermined specific value such as 0. If the exclusive OR or modulo sum is not the predetermined specific value such as 0, it is judged that an error has occurred. The signal qualities concerning channels are detected. Since the probability that data sent on a channel whose signal quality is detected to have deteriorated contains an error is high, the data items sent on channels other than the channel whose signal quality has deteriorated are exclusive-ORed or modulo-added. The calculated exclusive OR or modulo sum is replaced with the data sent on the channel whose signal quality has deteriorated. Thus, error correction is achieved. The present invention is advantageous in that error correction can be reliably performed on data items sent on a plurality of channels over a transmission medium or reproduced from a recording medium. The transmission medium over which high-level noises that are dispersed over a broad frequency band are superposed on a signal includes wire communication, radiocommunication, and optical communication.

Channels are divided into groups while being associated with the sides of the surfaces of a regular polyhedron. An exclusive OR is calculated and adopted as error correction data. Consequently, errors in data items sent on a plurality of channels can be corrected. Moreover, channels associated with the sides of a plurality of surfaces adjoining a certain surface are grouped together. It is judged whether an error is present in each group. If an error is present, error correction is performed on data items sent on a group of channels whose signal qualities have deteriorated. Thus, even if an error occurs on a plurality of channels simultaneously, the errors can be corrected reliably.

When each channel is assigned to a signal representing a plurality of bits, part of the bits is manipulated as a subset. The exclusive OR of bits belonging to subsets is calculated and used to perform error correction. Signal elements representing the remaining bits are identified. Therefore, the identification can be achieved with the interval between signal elements extended. Consequently, an error in the identification can be minimized.

What is claimed is:

1. An error correction device for correcting errors in data items sent on a plurality of channels, comprising:

an exclusive OR unit for assuming that at least one of the plurality of channels is used as an error correction channel, calculating the exclusive OR of data items sent on the remaining channels, adopting the calculated exclusive OR as data sent on the error correction channel, identifying the data items sent on the plurality of channels, and calculating the exclusive OR of the identified data items sent on the plurality of channels;

a signal quality detection unit for detecting the signal qualities concerning the plurality of channels; and an identifying and processing unit for, if an output of said exclusive OR unit is a predetermined specific value, providing the identified data items sent on the channels other than the error correction channel as they are, and for, if the output of said exclusive OR unit is not the specific value, replacing the identified data, which is sent on the channel whose signal quality is detected to be the worst by said signal quality detection unit, with the exclusive OR of the identified data items sent on the channels other than the channel whose signal quality is the worst, and then providing the resultant data.

2. An error correction device for correcting errors in data items sent on a plurality of channels, comprising:

an exclusive OR unit for assuming that channels are associated with the sides of each surface of a regular polyhedron and that a channel associated with one of the sides of each surface is used as an error correction channel, calculating the exclusive OR of data items sent on channels associated with the remaining sides, adopting the calculated exclusive OR as data sent on the error correction channel, identifying the data items sent on the plurality of channels, and calculating the exclusive OR of the identified data items sent on the error correction channel and the other channels associated with the same surface as the error correction channel is;

a signal quality detection unit for detecting the signal qualities concerning the plurality of channels that is associated with the sides of a surface and grouped together; and an identifying and processing unit for, if an output of said exclusive OR unit that calculates the exclusive OR of data items sent on channels associated with a surface is a predetermined specific value, providing the identified data items, which are sent on the channels other than the error correction channel associated with the same surface as the channels are, as they are, and for, if the output of said exclusive OR unit is not the specific value, replacing the identified data, which is sent on the channel whose signal quality is detected to be the worst by said signal quality detection unit, with the exclusive OR of the identified data items sent on the channels other than the channel whose signal quality is the worst, and providing the resultant data.

3. An error correction device according to claim 2, wherein: assuming that channels are associated with the sides of each surface of a regular polyhedron and that channels associated with the sides of a surface and the sides of a plurality of surfaces adjoining the surface are grouped together, if the exclusive OR of identified data items sent on the channels associated with a surface is not the predetermined specific value, said identifying and processing unit regards the same number of channels as the number of surfaces of the regular polyhedron, of which signal qualities are detected to have deteriorated by said signal quality detection unit, as error channels; said identifying and processing unit then solves simultaneous equations whose unknowns are data items assigned the error channels so as to thus correct the data items sent on the error channels.

4. An error correction device for correcting errors in data items sent on a plurality of channels, comprising:

an exclusive OR unit for assuming that each of a plurality of channels is assigned to a plurality of bits, that one bit or a plurality of bits out of the plurality of bits is manipulated as a subset, that the plurality of channels is grouped in units of a predetermined number of channels, and that one channel out of each group is used as an error correction channel, calculating the exclusive OR of subsets sent on the channels other than the error correction channel, adopting the calculated exclusive OR as a subset sent on the error correction channel, identifying the data items sent on the plurality of channels, and calculating the exclusive OR of the identified data items of the subsets sent on the channels belonging to the same group;

a signal quality detection unit for detecting the signal qualities concerning the channels, which belong to the same group, according to the subsets;

an error correction unit for, if an output of said exclusive OR unit is a predetermined specific value, providing the identified data items of the subsets, which are sent on the channels other than the error correction channel, as they are, and for, if the output is not the predetermined specific value, replacing the identified data, which is sent on the channel whose signal quality is detected to be the worst by said signal quality detection unit, with the exclusive OR of the identified data items of the subsets sent on the channels other than the channel whose signal quality is the worst, and providing the resultant data; and an identification unit for identifying bits other than the subsets, and providing the bits together with the subsets.

5. An error correction method for correcting errors in data items sent on a plurality of channels, comprising the steps of:

assuming that at least one of the plurality of channels is used as an error correction channel, calculating the exclusive OR of data items sent on the remaining channels, adopting the calculated exclusive OR as data sent on the error correction channel, and identifying the data items sent on the plurality of channels;

detecting the signal qualities concerning the channels according to the identified data items;

calculating the exclusive OR of the identified data items sent on the plurality of channels; and if the calculated exclusive OR is a predetermined specific value, providing the identified data items, which are sent on the channels other than the error correction channel, as they are, and, if the calculated exclusive OR is not the specific value, replacing the data, which is sent on the channel whose signal quality is detected to be the worst as a result of detecting the signal qualities concerning the plurality of channels, with the calculated exclusive OR of the identified data items sent on the channels other than the channel, and providing the resultant data.

6. An error correction method for correcting errors in data items sent on a plurality of channels, comprising the steps of:

assuming that channels are associated with the sides of each surface of a regular polyhedron and that a channel associated with one side of each surface is used as an error correction channel, calculating the exclusive OR of data items sent on the channels associated with the remaining sides, adopting the calculated exclusive OR as data sent on the error correction channel, and identifying the data items sent on the plurality of channels;

detecting the signal qualities concerning the channels according to the identified data items; and if the calculated exclusive OR of the data items sent on the channels associated with a surface is a predetermined specific value, providing the identified data items sent on the channels other than the error correction channel, which is associated with the same surface as the channels are, as they are, and, if the calculated exclusive OR is not the specific value, replacing the identified data, which is sent on the channel whose signal quality is detected to be the worst as a result of detecting the signal qualities concerning the channels, with the exclusive OR of the identified data items sent on the channels other than the channel, and providing the resultant data.

7. An error correction method according to claim 6, wherein: assuming that channels are associated with the sides of each surface of a regular polyhedron and that channels associated with the sides of each surface and the sides of a plurality of surfaces adjoining the surface are grouped together, if the exclusive OR of identified data items sent on the channels associated with a surface is not the predetermined specific value, the same number of channels as the number of surfaces of the regular polyhedron, of which signal qualities are detected to have deteriorated as a result of detecting the signal qualities concerning the channels, are regarded as error channels; and simultaneous equations whose unknowns are data items assigned the error channels are solved in order to thus correct the data items sent on the error channels.

8. An error correction method according to claim 6, further comprising a step at which: if the exclusive OR of the identified data items sent on the channels associated with a surface of the regular polyhedron is not the specific value, the same number of channels as the number of surfaces of the regular polyhedron, of which signal qualities are detected to have deteriorated as a result of detecting the signal qualities concerning the channels, are regarded as error channels; a coefficient assigned to the error channel associated with the surface is set to 1; the error channels associated with other surfaces that belong to the same group as the surface does are successively selected and the coefficients assigned to the error channels are set to 0; and finally if the coefficients assigned to the error channels associated with the same group of surfaces still assume any values other than 0, the data items sent on the error channels are judged to contain errors, and the errors are corrected.

9. An error correction method for correcting errors in data items sent on a plurality of channels, comprising the steps of:

assuming that each of a plurality of channels is assigned to a plurality of bits, that one bit or a plurality of bits out of the plurality of bits is manipulated as a subset, and that at least one of the plurality of channels is used as an error correction channel, calculating the exclusive OR of the subsets sent on the channels other than the error correction channel, adopting the calculated exclusive OR as a subset sent on the error correction channel, identifying the data items sent on the plurality of channels, and calculating the exclusive OR of the identified data items of the subsets;

detecting the signal qualities concerning the channels according to the subsets;

if the calculated exclusive OR is a predetermined specific value, providing the identified data items of the subsets, which are sent on the channels other than the error correction channel, as they are, and if the calculated exclusive OR is not the predetermined specific value, replacing the identified data, which is sent on the channel whose signal quality is detected to be the worst as a result of detecting the signal qualities concerning the channels, with the exclusive OR of the identified data items of the subsets sent on the channels other than the channel whose signal quality is the worst, and providing the resultant data; and identifying bits other than the subsets, and providing the identified bits together with the subsets.

10. An error correction method according to claim 9, further comprising a step at which: assuming that the plurality of channels is divided into a plurality of groups and that one channel out of each group is used as an error correction channel, the exclusive OR of subsets sent on the channels other than the error correction channel, belonging to the same group as the channels do, is adopted as a subset sent on the error correction channel belonging to the group; and an error in the subset sent on the channel whose signal quality is detected to be the worst as a result of detecting the signal qualities concerning the channels belonging to the group is corrected according to the identified data of the subset sent on the error correction channel.

* * * * *